(12) United States Patent
Meng et al.

(10) Patent No.: US 10,707,381 B2
(45) Date of Patent: *Jul. 7, 2020

(54) LIGHT EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Cheng Meng, Xiamen (CN); Yuehua Jia, Xiamen (CN); Jing Wang, Xiamen (CN); Chun-Yi Wu, Xiamen (CN); Ching-Shan Tao, Xiamen (CN); Duxiang Wang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/522,634

(22) Filed: Jul. 25, 2019

(65) Prior Publication Data
US 2019/0348572 A1  Nov. 14, 2019

Related U.S. Application Data

(63) Continuation of application No. 16/101,198, filed on Aug. 10, 2018, now Pat. No. 10,411,163, which is a (Continued)

(30) Foreign Application Priority Data

Mar. 5, 2015 (CN) .......................... 2015 1 0097522
Dec. 29, 2017 (CN) .......................... 2017 1 1476546
Dec. 29, 2017 (CN) ...................... 2017 2 1898534 U
Dec. 29, 2017 (CN) ...................... 2017 2 1898549 U

(51) Int. Cl.
*H01L 33/42* (2010.01)
*H01L 33/40* (2010.01)
(Continued)

(52) U.S. Cl.
CPC ........ *H01L 33/405* (2013.01); *H01L 33/0079* (2013.01); *H01L 33/38* (2013.01); *H01L 33/42* (2013.01); *H01L 33/44* (2013.01); *H01L 33/30* (2013.01); *H01L 2933/0016* (2013.01); *H01L 2933/0025* (2013.01)

(58) Field of Classification Search
CPC ...... H01L 33/42; H01L 33/60; H01L 51/5203
See application file for complete search history.

*Primary Examiner* — George R Fourson, III
(74) *Attorney, Agent, or Firm* — Syncoda LLC; Feng Ma

(57) ABSTRACT

A light-emitting diode includes a light-emitting epitaxial laminated layer having a first surface and a second, opposing, surface, including an n-type semiconductor layer, a light emitting layer, and a p-type semiconductor layer; an omnidirectional reflector structure formed on the second surface of the light-emitting epitaxial laminated layer, including a transparent dielectric layer located on the second surface of the light-emitting epitaxial laminated layer and having conductive holes therein; a first transparent adhesive layer on one side surface of the transparent dielectric layer that is distal from the light-emitting epitaxial laminated layer; a second transparent adhesive layer on one side surface of the first transparent adhesive layer that is distal from the transparent dielectric layer; and a metal reflective layer on one side surface of the second transparent adhesive layer that is distal from the first transparent adhesive layer.

11 Claims, 21 Drawing Sheets

Related U.S. Application Data continuation-in-part of application No. 15/647,127, filed on Jul. 11, 2017, now Pat. No. 10,050,181, which is a continuation of application No. PCT/CN2015/097539, filed on Dec. 16, 2015.

(51) Int. Cl.
*H01L 33/44* (2010.01)
*H01L 33/38* (2010.01)
*H01L 33/00* (2010.01)
*H01L 33/30* (2010.01)

LIGHT EMITTING DIODE AND FABRICATION METHOD THEREOF

CROSS-REFERENCE TO RELATED APPLICATIONS

The present application is a continuation of U.S. patent application Ser. No. 16/101,198 filed on Aug. 10, 2018, which is a continuation-in-part of U.S. patent application Ser. No. 15/647,127 filed on Jul. 11, 2017 (Now U.S. Pat. No. 10,050,181), which claims priority to Chinese Patent Application Nos. 201711476546.4, 201721898534.6, and 201721898549.2, all filed on Dec. 29, 2017, and is a continuation of, and claims priority to, PCT/CN2015/097539 filed on Dec. 16, 2015, which in turn claims priority to Chinese Patent Application No. 201510097522.2 filed on Mar. 5, 2015. The disclosures of these applications are hereby incorporated by reference in their entirety.

BACKGROUND

In recent years, light-emitting diodes (LEDs) have been widely applied and play an increasingly more important role in various fields such display system, lighting system and automobile tail light. An LED with AlGaInP-based light-emitting layer has high internal quantum efficiency. However, external quantum efficiency of conventional LED has been restricted by many factors, such as internal total reflection, metal electrode blocking and light absorption by GaAs semiconductor material.

SUMMARY

The present disclosure provides a light emitting diode that effectively enhances external extraction efficiency thereof. The inventors of the present disclosure have recognized that, for those LEDs growing over light-absorption substrates, a good part of light is finally absorbed by the substrate. Therefore, for those conventional LED structures, external quantum efficiency remains low even internal photoelectric converting efficiency is high. Methods to improve LED light extraction efficiency include thinning window layer, surface roughening, transparent substrate, inverted pyramid structure, etc.

To enhance luminance of existing light emitting diodes, a reflecting mirror is generally fabricated between the chip epitaxial layer and the light-absorption substrate via bonding process, which prevents the light emitted from the chip from being absorbed by the light-absorption substrate and also reflects the light to the light-emitting surface, thus improving overall luminance. The mirror is often made of high-reflectivity metal materials corresponding to chip wavelength, such as Au/Ag mirror for red light, and Al/Ag for blue and green light.

Technical approaches of the present disclosure can include: a light-emitting diode (LED), comprising a light-emitting epitaxial laminated layer, a transparent dielectric layer, a transparent conductive layer and a metal reflective layer, wherein, the light-emitting epitaxial laminated layer has a first surface and a second surface that are opposite to each other, comprising an n-type semiconductor layer, a light emitting layer and a p-type semiconductor layer; the transparent dielectric layer is located on the second surface of the light-emitting epitaxial laminated layer and is in direct contact with the light-emitting epitaxial laminated layer, inside which are conductive holes; the transparent conductive layer is located on one side surface of the transparent dielectric layer that is distal from the light-emitting epitaxial laminated layer; the metal reflective layer is located on one side surface of the transparent conductive layer that is distal from the transparent dielectric layer; and refractivity of the transparent dielectric layer is less than that of the light-emitting epitaxial laminated layer and the transparent conductive layer. In this present disclosure, the light-emitting epitaxial laminated layer can be equivalent to a high-refractivity layer, the transparent dielectric layer can be equivalent to a low-refractivity and high-transmittance layer; and the transparent conductive layer can be equivalent to a high-refractivity and high-transmittance conductive layer. The three layers form a reflectivity-enhancing system. Further, the transparent conductive layer and the metal reflective layer form an omni-directional reflector structure.

In some embodiments, refractivity of the light-emitting epitaxial laminated layer, the transparent dielectric layer and the transparent conductive layer is r1, r2 and r3 respectively, with relationship satisfying: $r2<r3<r1$.

In some embodiments, roughness of the second surface of the light-emitting epitaxial laminated layer is less than that of the first surface. In some embodiments, the second surface of the light-emitting epitaxial laminated layer is a surface at one side of the n-type semiconductor layer.

In some embodiments, the transparent dielectric layer is doped with foaming particles which generate gas bubbles when heated, thereby reducing refractivity of the transparent dielectric layer and achieving scattering effect. This enhances the total reflection probability of the interface between the emitting epitaxial layer and the transparent dielectric layer. In some embodiments, the foaming particles are selected from any one of $CaCO_3$, $BaCO_3$, $Ca(HCO_3)_2$, $Na_2CO_3$, $NaHCO_3$ or their combinations.

In some embodiments, the transparent conductive layer has good adhesiveness and bridges the light-emitting epitaxial laminated layer and the metal reflective layer. This increases interface strength and avoids the metal reflective layer from stripping off the epitaxy. In some preferred embodiments, the transparent conductive layer is a sputtered ITO material layer (S-ITO for short), and the metal reflective layer is an Ag reflector. As the S-ITO and the Ag reflector are well adhesive to the light-emitting epitaxial laminated layer, and would not have chemical reaction with the light-emitting epitaxial laminated layer under high temperature, the smoothness of the interface between the light-emitting epitaxial laminated layer and the transparent conductive layer is not affected. Therefore, this improves mirror reflectivity and further enhances light extraction rate of LED. In some preferred embodiments, the S-ITO is in molecular state and distributes on the transparent dielectric layer in granular shape. Preferred thickness is 10-100 Å, within which, the film is not yet formed and is in molecular state with least light absorption. In addition, the S-ITO is distributed on the surface of the transparent dielectric layer in granular shape, thereby having little effect on mirror smoothness.

In some embodiments, the first surface of the light-emitting epitaxial laminated layer has a plurality of roughened patterns in honeycomb structure appearing in regular hexagon. This roughened structure has high utility rate of space and effectively enhances light extraction rate. In some embodiments, the honeycomb structure is hemispherical.

The present disclosure also provides a fabrication method of light emitting diode, mainly comprising the steps below: a light emitting diode fabrication method, comprising: 1) forming a light-emitting epitaxial laminated layer on the growth substrate, which comprises at least an n-type semiconductor layer, a light emitting layer and a p-type semiconductor layer; 2) fabricating an electrode on the p-side surface of the light-emitting epitaxial laminated layer, and annealing to form ohmic contact; 3) bonding a temporary substrate on the p-side surface of the light-emitting epitaxial laminated layer; 4) removing the growth substrate, and exposing the n-side surface; 5) consecutively forming a transparent conductive layer and a metal reflective layer and annealing to form ohmic contact on the n-side surface of the light-emitting epitaxial laminated layer; 6) bonding a substrate on the metal reflective layer and removing the temporary substrate. In this fabrication method, thermal treatment is done before substrate bonding to form n-side ohmic contact and p-side ohmic contact. As a result, thermal treatment is not required after evaporation of the metal reflective layer, which may loss luminance.

The present disclosure also provides a light emitting diode, comprising a light-emitting epitaxial laminated layer and an omnidirectional reflector structure, wherein, the light-emitting epitaxial laminated layer has a first surface and a second surface that are opposite to each other, comprising an n-type semi-conductive layer, a light emitting layer and a p-type semiconductor layer; the omnidirectional reflector structure is formed on the second surface of the light-emitting epitaxial laminated layer, comprising a transparent dielectric layer on the second surface of the light-emitting epitaxial laminated layer, inside which are conductive holes; a first transparent adhesive layer on one side surface of the transparent dielectric layer that is distal from the light-emitting epitaxial laminated layer, and covers the side wall of the conductive holes; a second transparent adhesive layer on one side surface of the first transparent adhesive layer that is distal from the transparent dielectric layer; and a metal reflective layer on one side of the second transparent adhesive layer that is distal from the first transparent adhesive layer.

In some embodiments, thickness of the transparent dielectric layer is more than 50 nm.

In some embodiments, the first transparent adhesive layer is a transparent isolating adhesive layer, which covers one side surface of the transparent dielectric layer that is distal from the light-emitting epitaxial laminated layer.

In some embodiments, thickness of the first transparent adhesive layer is less than 20 nm.

In some embodiments, the second transparent adhesive layer is a transparent conductive adhesive layer.

In some embodiments, thickness of the second transparent adhesive layer is less than 10 nm.

In some embodiments, thickness of the first transparent adhesive layer is less than 1/10 of the thickness of the transparent dielectric layer.

In some embodiments, the transparent dielectric layer is composed of a plurality of sub-layers, wherein, thickness of the first transparent adhesive layer is less than 1/5 of the thickness of any sub-layer of the transparent dielectric layer.

In some embodiments, the transparent dielectric layer is a MgF layer; the first transparent adhesive layer is a SiO layer; the second transparent adhesive layer is a sputtered ITO layer; and the metal reflective layer is an Ag reflector.

In some embodiments, the light emitting diode also comprises a diffusion blocking layer, which wraps the surface and the side wall at the side of the metal reflective layer that is distal from the light-emitting epitaxial laminated layer.

In some embodiments, the conductive holes are filled with a metal ohmic contact layer, wherein, the surface at the side that is distal from the epitaxial laminated layer is flush with the first transparent adhesive layer.

The present disclosure also provides a light emitting diode, comprising a light-emitting epitaxial laminated layer and an omnidirectional reflector structure, wherein, the light-emitting epitaxial laminated layer has a first surface and a second surface that are opposite to each other, comprising an n-type semi-conductive layer, a light emitting layer and a p-type semiconductor layer; the omnidirectional reflector structure is formed on the second surface of the light-emitting epitaxial laminated layer, comprising a transparent dielectric layer on the second surface of the light-emitting epitaxial laminated layer, inside which are conductive holes, at least comprising a first layer and a second layer; the first layer is adjacent to the light-emitting epitaxial laminated layer, and the second layer is distal from the light-emitting epitaxial laminated layer, wherein, the second layer is a thin structure with thickness less than 1/10 that of the first layer, which serves as an adhesive layer of the first layer; a transparent conductive adhesive layer on the surface of the second sub-layer of the transparent dielectric layer; and a metal reflective layer on one side surface of the transparent conductive adhesive layer that is distal from the transparent dielectric layer.

In some embodiments, the first layer is composed of a plurality of sub-layers, wherein, thickness of the second layer is less than 1/5 of the thickness of any sub-layer of the first layer.

In some embodiments, thickness of the first layer appears gradual distribution, wherein, thickness of the layer adjacent to the light-emitting epitaxial laminated layer is at maximum and decreases gradually.

In some embodiments, thickness of the first layer is more than 50 nm.

In some embodiments, thickness of the second layer is less than 20 nm.

In some embodiments, thickness of the transparent conductive adhesive layer is less than 10 nm.

In some embodiments, the first layer is an MgF layer; the second layer is a SiO layer; the transparent conductive adhesive layer is an ITO layer; and the metal reflective layer is an Ag reflector.

In some embodiments, the conductive holes are filled with a metal ohmic contact layer, wherein, the surface at the side that is distal from the epitaxial laminated layer is flush with the transparent dielectric layer.

In some embodiments, the light emitting diode also comprises an anti-diffusion protective layer, which wraps the surface and the side wall at the side of the metal reflective layer that is distal from the light-emitting epitaxial laminated layer.

In some embodiments, the anti-diffusion protective layer is connected to the metal reflective layer with no gap.

The present disclosure also provides a light emitting diode with a highly-reliable mirror structure and the fabrication method thereof.

According to another aspect of the present disclosure, a light emitting diode is provided, comprising: a light-emitting epitaxial laminated layer, comprising a first-type semiconductor layer, an active layer and a second-type semiconductor layer, having a first surface and a second surface that are opposite to each other, wherein, the first surface is a light emitting surface; a metal reflective layer formed on the second surface of the light-emitting epitaxial laminated layer; and a protective layer formed on the surface and the side wall of the metal reflective layer, with gapless connection to the metal reflective layer.

In some embodiments, the included angle between the side wall of the metal reflective layer and the epitaxial laminated layer is 45-85°.

In some embodiments, between the second surface of the light-emitting epitaxial laminated layer and the metal reflective layer are consecutively provided with: a transparent dielectric layer on the second surface of the light-emitting epitaxial laminated layer, inside which are conductive holes; a first transparent adhesive layer on one side surface of the transparent dielectric layer that is distal from the light-emitting epitaxial laminated layer, and covers the side wall of the conductive holes; a second transparent adhesive layer on one side surface of the first transparent adhesive layer that is distal from the transparent dielectric layer.

In some embodiments, thickness of the transparent dielectric layer is more than 50 nm.

In some embodiments, the first transparent adhesive layer is a transparent isolating adhesive layer, which covers one side surface of the transparent dielectric layer that is distal from the light-emitting epitaxial laminated layer.

In some embodiments, thickness of the first transparent adhesive layer is less than 20 nm.

In some embodiments, the second transparent adhesive layer is a transparent conductive adhesive layer.

In some embodiments, thickness of the second transparent adhesive layer is less than 10 nm.

In some embodiments, thickness of the first transparent adhesive layer is less than $1/10$ of the thickness of the transparent dielectric layer.

In some embodiments, the transparent dielectric layer is composed of a plurality of sub-layers, wherein, thickness of the first transparent adhesive layer is less than $1/5$ of the thickness of any sub-layer of the transparent dielectric layer.

In some embodiments, the transparent dielectric layer is a MgF layer; the first transparent adhesive layer is a SiO layer; the second transparent adhesive layer is an ITO layer; and the metal reflective layer is an Ag reflector.

In some embodiments, the conductive holes are filled with a metal ohmic contact layer, wherein, the surface at the side that is distal from the epitaxial laminated layer is flush with the first transparent adhesive layer.

In some embodiments, between the second surface of the light-emitting epitaxial laminated layer and the reflective layer are consecutively provided with: a transparent dielectric layer on the second surface of the light-emitting epitaxial laminated layer, inside which are conductive holes, at least comprising a first layer and a second layer; the first layer is adjacent to the light-emitting epitaxial laminated layer, and the second layer is distal from the light-emitting epitaxial laminated layer, wherein, the second layer is a thin structure with thickness less than $1/10$ that of the first layer, which serves as an adhesive layer of the first layer; and a transparent conductive adhesive layer on the surface of the second sub-layer of the transparent dielectric layer.

In some embodiments, the first layer is composed of a plurality of sub-layers, wherein, thickness of the second layer is less than $1/5$ of the thickness of any sub-layer of the first layer.

In some embodiments, thickness of the first layer is more than 50 nm.

In some embodiments, thickness of the second layer is less than 20 nm.

In some embodiments, thickness of the transparent conductive adhesive layer is less than 10 nm.

In some embodiments, the first layer is an MgF layer; the second layer is a SiO layer; the transparent conductive adhesive layer is an ITO layer, and the metal reflective layer is an Ag reflector.

According to another aspect of the present disclosure, a fabrication method for light emitting diode comprises: (1) providing a light-emitting epitaxial structure, comprising a first-type semiconductor layer, an active layer and a second-type semiconductor layer, having a first surface and a second surface that are opposite to each other, wherein, the first surface is a light emitting surface; (2) forming a metal reflective layer on the second surface of the epitaxial structure; (3) wet etching the edge of the metal reflective layer to appear a regular trapezoidal section or a rectangle section; and (4) forming a protective layer on the metal reflective layer, which covers the upper surface and the side wall of the metal reflective layer and forms gapless connection to the metal reflective layer.

In some embodiments, step (3) comprises following sub-steps: (31) preheating the edge surface of the metal reflective layer; (32) forming a mask layer on the metal reflective layer, and at least exposing the pre-treated surface of the metal reflective layer; and (33) etching the metal reflective layer, wherein, the etched metal reflective layer appears a regular trapezoidal section or a rectangle section as the etching rate of the pre-heated region is higher.

In some embodiments, in step (31), the pretreatment is an oxidation treatment.

In some embodiments, in step (31), form an isolating layer in the middle of the metal reflective layer for protection, and perform oxidation treatment for the edge surface of the reflective layer.

In some embodiments, step (2) comprises following sub-steps: (21) forming a transparent dielectric layer on the second surface of the light-emitting epitaxial laminated layer, inside which are conductive holes; (22) forming a transparent adhesive layer on the transparent dielectric layer, which covers the upper surface of the transparent dielectric layer and the side wall of the conductive holes; (23) forming a second transparent adhesive layer on the transparent dielectric layer; and (24) forming a metal reflective layer on the second transparent adhesive layer; wherein, thickness of the first transparent adhesive layer is less than $1/10$ of the thickness of the transparent dielectric layer.

In some embodiments, step (2) comprises following sub-steps: (21) forming a transparent dielectric layer on the second surface of the light-emitting epitaxial laminated layer, inside which are conductive holes, at least comprising a first layer and a second layer; the first layer is adjacent to the light-emitting epitaxial laminated layer, and the second layer is distal from the light-emitting epitaxial laminated layer, wherein, the second layer is a thin structure with thickness less than $1/10$ that of the first layer, which serves as an adhesive layer of the first layer; (22) forming a transparent adhesive layer on the transparent dielectric layer; and (23) forming a metal reflective layer on the transparent adhesive layer.

In another aspect, a light-emitting system is provided including a plurality of the LEDs according to embodiments disclosed herein. The light-emitting system can be used for lighting, signage, display, etc.

Other features and advantages of various embodiments of the present disclosure will be described in detail in the following specification, and it is believed that such features and advantages will become more obvious in the specification or through implementations of this invention. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the invention and constitute a part of this specification, together with the embodiments, are therefore to be considered in all respects as illustrative and not restrictive. In addition, the drawings are merely illustrative, which are not drawn to scale.

Figure 1:
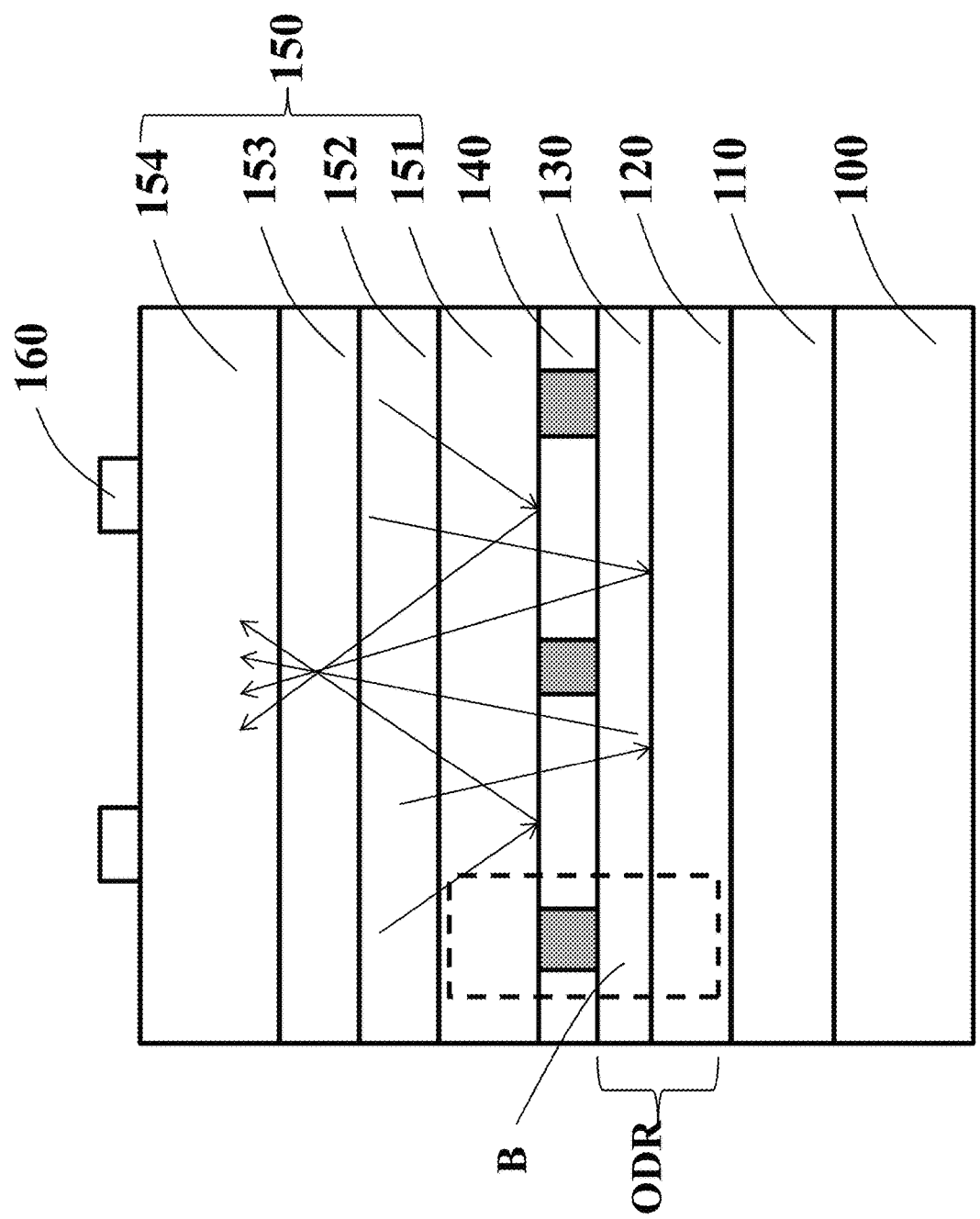
FIG. 1 is a sectional view showing the light emitting diode structure in accordance with Embodiment 1 of the present disclosure.

In the drawing:
1110, 1210, 1310, 1410: light-emitting epitaxial laminated layer;
1120, 1220, 1326, 1426: metal reflective layer;
1320, 1420: reflective structure;
1321, 1421: transparent dielectric layer;
1322, 1422: holes;
1323: first transparent adhesive layer;
1324: metal ohmic contact layer;
1325: second transparent adhesive layer;
1425: transparent conductive adhesive layer;
1130, 1230: mask layer;
1140, 1240, 1340, 1440: protective layer;
1150: voids or cracks;
1260: isolation layer;
1361: upper bonding layer;
1362: lower bonding layer;
1370, 1470: conductive substrate.

DETAILED DESCRIPTION

The LED structure is described in detail with reference to the schematic diagrams, to help understand and practice the disclosed embodiments, regarding how to solve technical problems using technical approaches for achieving the technical effects. It should be understood that the embodiments and their characteristics described in this disclosure may be combined with each other and such technical proposals are deemed to be within the scope of this disclosure without departing from the spirit of this invention.

FIG. 1 shows the light emitting diode according to the first preferred embodiment of the present disclosure, comprising from bottom to up: a substrate 100, a metal bonding layer 110, a metal reflective layer 120, a transparent conductive layer 130, a transparent dielectric layer 140, and a light-emitting epitaxial laminated layer 150, wherein, the light-emitting epitaxial laminated layer 150 comprises a first semiconductor layer 151, a light emitting layer 152 and a second semiconductor layer 153. When the first semiconductor layer 151 is a p-type semiconductor, the second semiconductor layer 153 can be an n-type semiconductor with different electrical property. On the contrary, when the first semiconductor layer 151 is an n-type semiconductor, the second semiconductor layer 153 can be a p-type semiconductor with different electrical property. The light emitting layer 152 is between the first semiconductor layer 151 and the second semiconductor layer 153, which can be a neutral-type, a p-type or an n-type semiconductor. When the applied current passes through the light-emitting epitaxial laminated layer, the light emitting layer 152 emits light. When the light emitting layer 152 is made of nitride-based material, blue or green light will be emitted; when made of AlInGaP-based material, red, orange or yellow light in amber color will be emitted. In this embodiment, the first semiconductor layer 151 is an n-type semiconductor, and the second semiconductor layer 153 is a p-type semiconductor. The light emitting layer 152 is made of AlGaInP-based material. Above the second semiconductor layer 153 is a GaP window layer.

Figure 2:
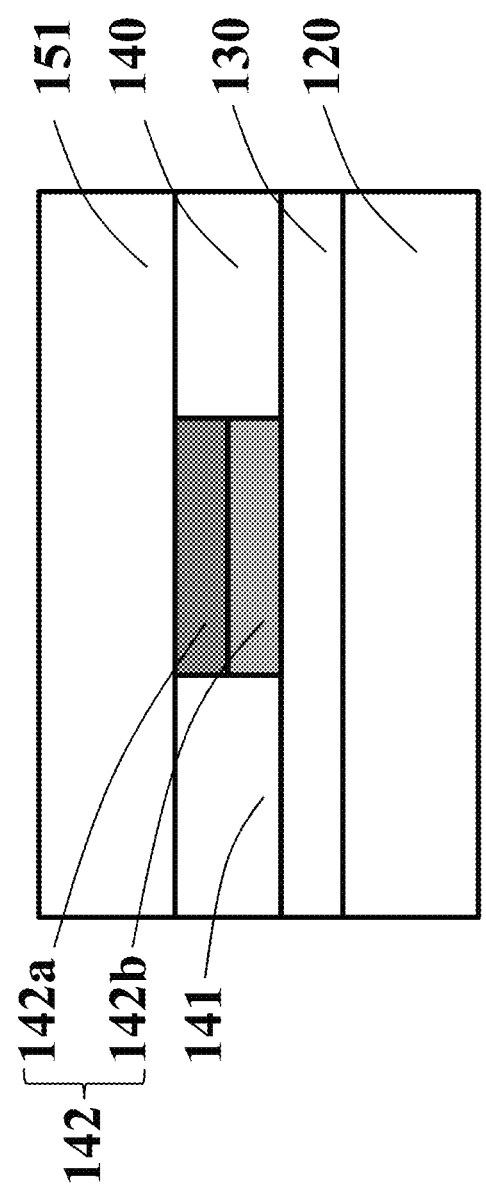
FIG. 2 is a partial enlarged view of portion B in FIG. 1.

Specifically, the metal reflective layer 120 is a high-reflectivity material layer, and Ag reflector is preferred. Due to poor adhesiveness of the Ag reflector and the epitaxy, the transparent conductive layer 130 can be an ITO material layer that is well adhesive to both the epitaxy and the Ag reflector. This improves adhesive strength and forms an ODR system with the mirror. In some embodiments, for the transparent conductive layer 130, S-ITO is preferred, and preferred thickness is 10-100 Å, within which, the ITO film is not yet formed and is distributed on the surface of the transparent dielectric layer 140 in modular state. As the S-ITO is well adhesive to the epitaxy, and would not have chemical reaction with the epitaxy under high temperature, which may damage mirror smoothness and affect reflectivity. The transparent dielectric layer 140 is composed of a silicon dioxide material layer 141, inside which are conductive holes 142. The conductive holes can directly be filled with transparent conductive materials, or be composed of an n-GaAs layer 142a and an n-type ohmic contact layer 142b; FIG. 2 is a partial enlarged view of B in FIG. 1.

In this embodiment, the transparent conductive layer 130 and the metal reflective layer 120 form an omni-directional reflective structure. A transparent dielectric layer 140 is added between the transparent conductive layer 130 and the light-emitting epitaxial laminated layer 150, wherein, the transparent dielectric layer 140 is a low-refractivity and high-transmittance layer, and the refractivity is less than that of the light-emitting epitaxial laminated layer and the transparent conductive layer. The transparent conductive layer 130 and the light-emitting epitaxial laminated layer 150 form a reflectivity-enhancing system, which also serves as an n-type current blocking layer.

In general, in a light emitting epitaxial structure, roughness of the n-side bottom surface is less than that of the p-side upper surface. Taking AlGaInP material as an example, the growth substrate is often made of GaAs, and roughness Ra of the n-side bottom surface can be equivalent to that of the GaAs substrate, which is about 0.174 nm, and roughness Ra of the p-side surface is about 3.56 nm. When light enters the optically thinner medium from optically denser medium, a smooth surface is more prone to total reflection than a roughened surface. In the light emitting diode as shown in FIG. 1, the first semiconductor layer is an n-type semiconductor, adjoining to the omni-directional reflective structure. In this omni-directional reflective system, roughness of the interface between the optically denser medium (the first semiconductor layer 151) and the optically thinner medium (the transparent dielectric layer 140) is small. Therefore, downward light emitted from the light emitting layer is much more likely to be totally reflected back to the inside part of the epitaxy, thus significantly enhancing light extraction rate of LED.

Figure 3:
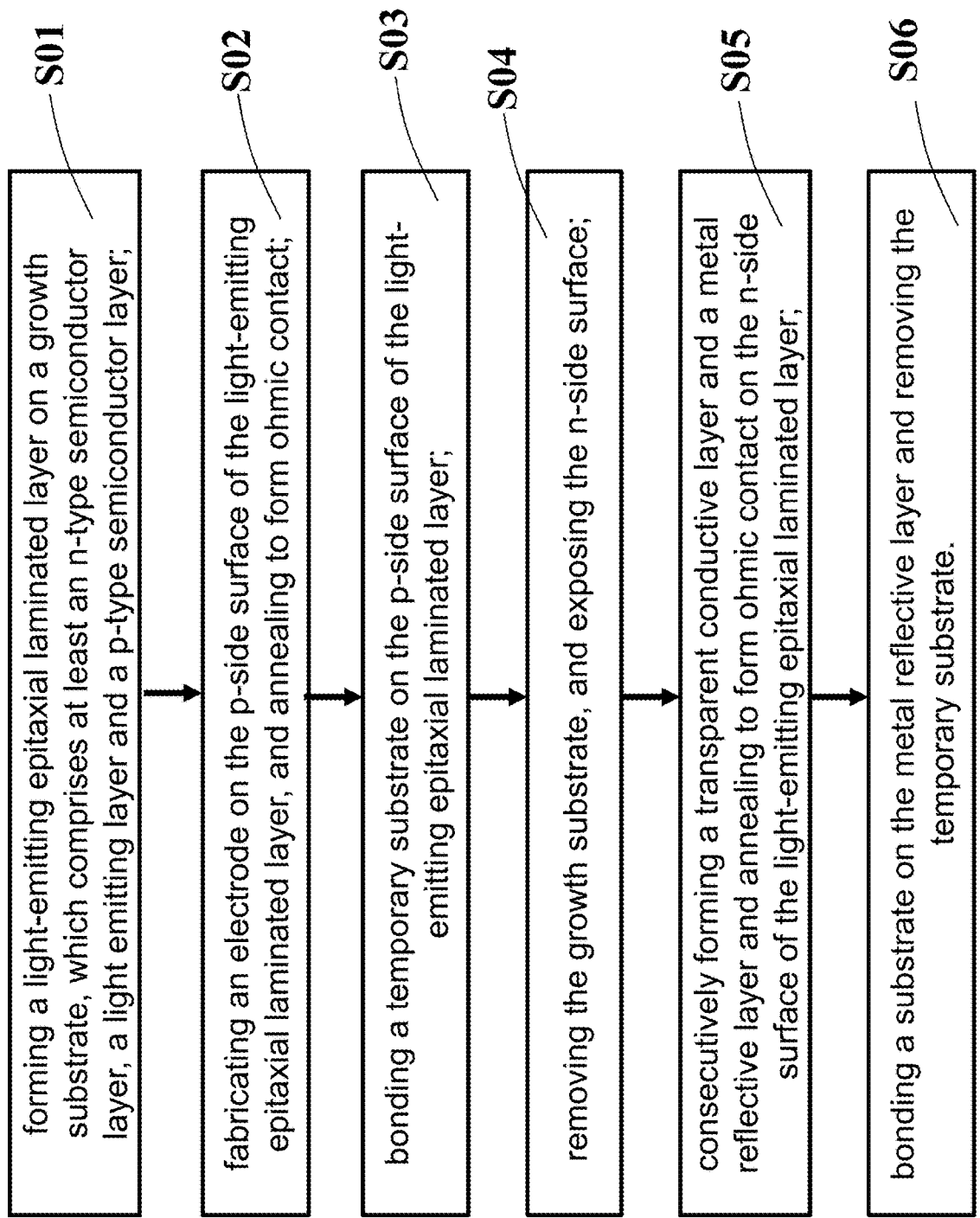
FIG. 3 is a flow diagram of fabricating the light emitting diode as shown in FIG. 1.

FIG. 3 is a flow diagram of the light emitting diode as shown in FIG. 1, mainly comprising steps below: S01: forming a light-emitting epitaxial laminated layer on the growth substrate, which comprises at least an n-type semiconductor layer, a light emitting layer and a p-type semiconductor layer; S02: fabricating an electrode on the p-side surface of the light-emitting epitaxial laminated layer, and annealing to form ohmic contact; S03: bonding a temporary substrate on the p-side surface of the light-emitting epitaxial laminated layer; S04: removing the growth substrate, and exposing the n-side surface; S05: consecutively forming a transparent conductive layer and a metal reflective layer and annealing to form ohmic contact on the n-side surface of the light-emitting epitaxial laminated layer; S06: bonding a substrate on the metal reflective layer and removing the temporary substrate Detailed descriptions will be given to the fabrication method of the light emitting diode with reference to FIGS. 4-10.

Figure 4:
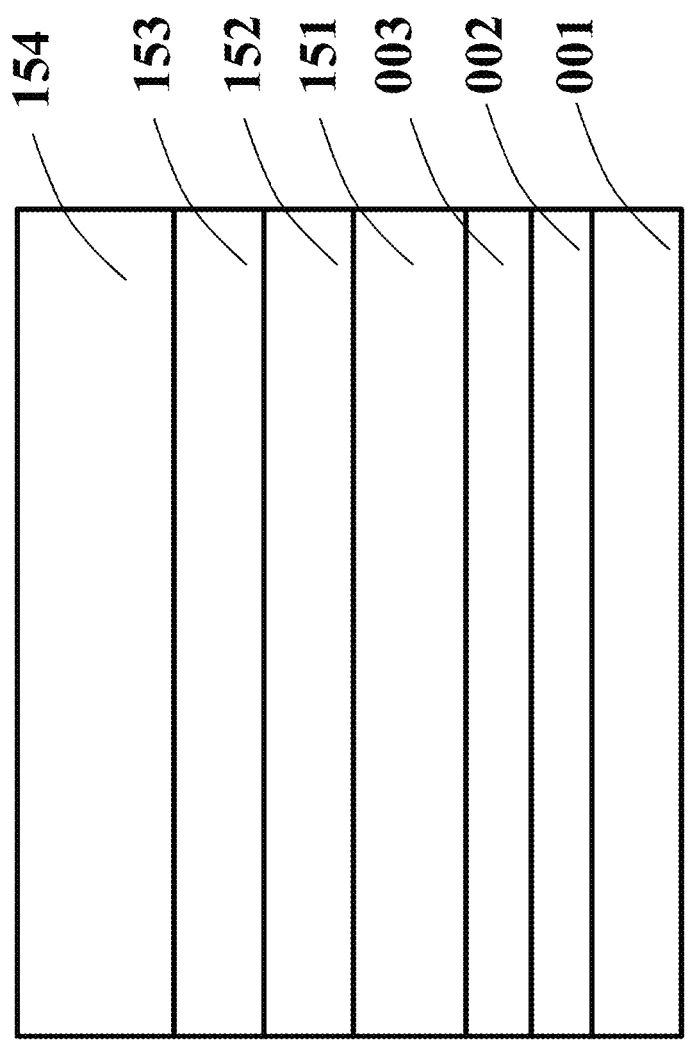
FIG. 4 is a sectional view of a first step of a manufacturing process for the light emitting diode as shown in FIG. 1.

With reference to FIG. 4, consecutively form an InGaP blocking layer 002, an n-type GaAs ohmic contact layer 003, an n-type semiconductor layer 151, a light emitting layer 152, a p-type semiconductor layer 153 and a window layer 154 via epitaxial growth on the GaAs substrate 001.

Figure 5:
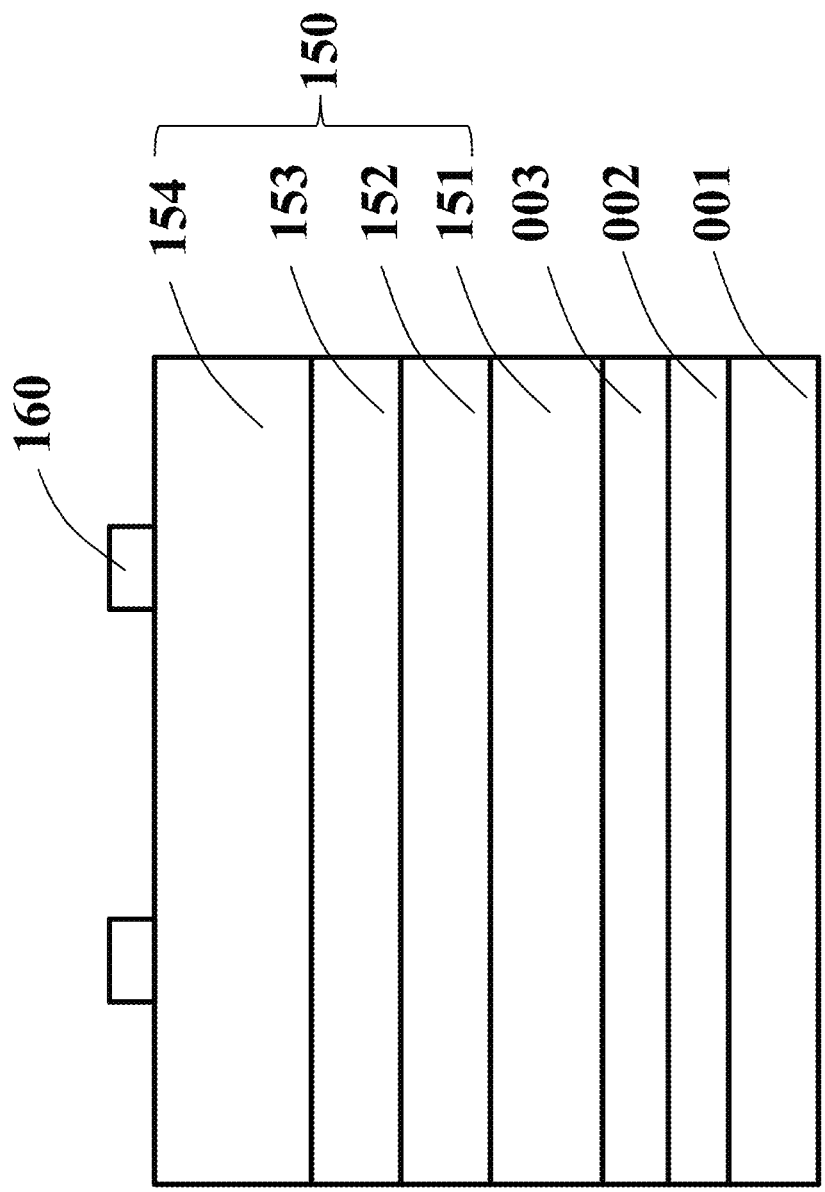
FIG. 5 is a sectional view of a second step of a manufacturing process for the light emitting diode as shown in FIG. 1.

With reference to FIG. 5, fabricate a p-electrode 160 on the surface of the window layer 154, and form ohmic contact via thermal treatment.

Figure 6:
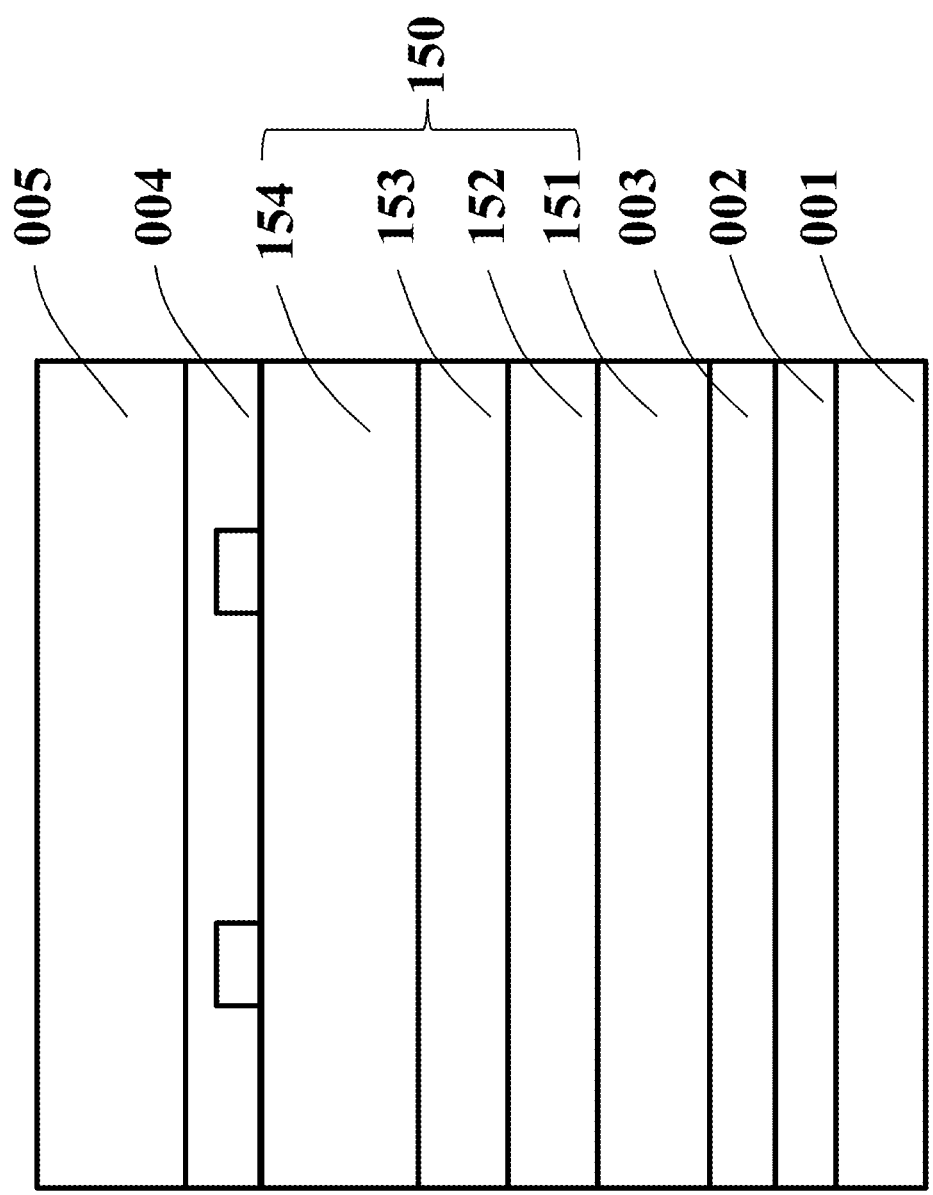
FIG. 6 is a sectional view of a third step of a manufacturing process for the light emitting diode as shown in FIG. 1.
Figure 7:
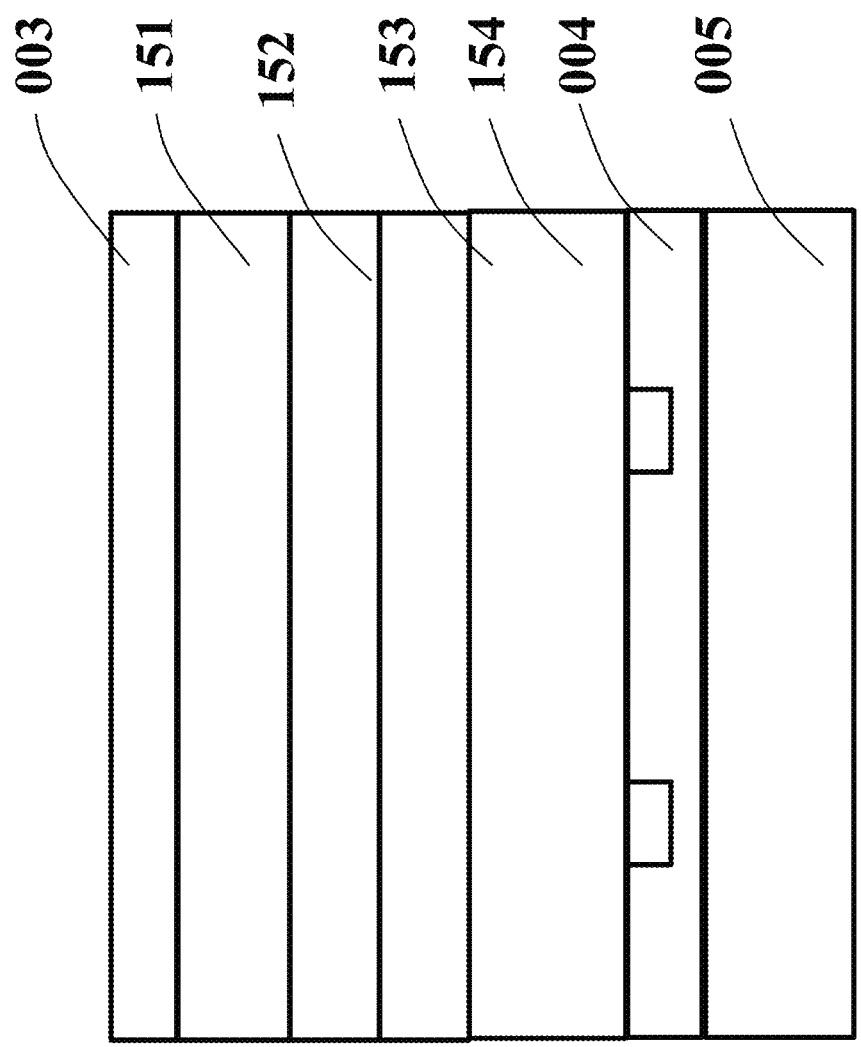
FIG. 7 is a sectional view of a fourth step of a manufacturing process for the light emitting diode as shown in FIG. 1.

With reference to FIG. 6 and FIG. 7, bond a temporary substrate 005 via the bonding layer 004 on the surface of the window layer 154, and remove the GaAs substrate 001 and the InGaP blocking layer 002 to expose the surface of the n-type GaAs ohmic contact layer 003.

Figure 8:
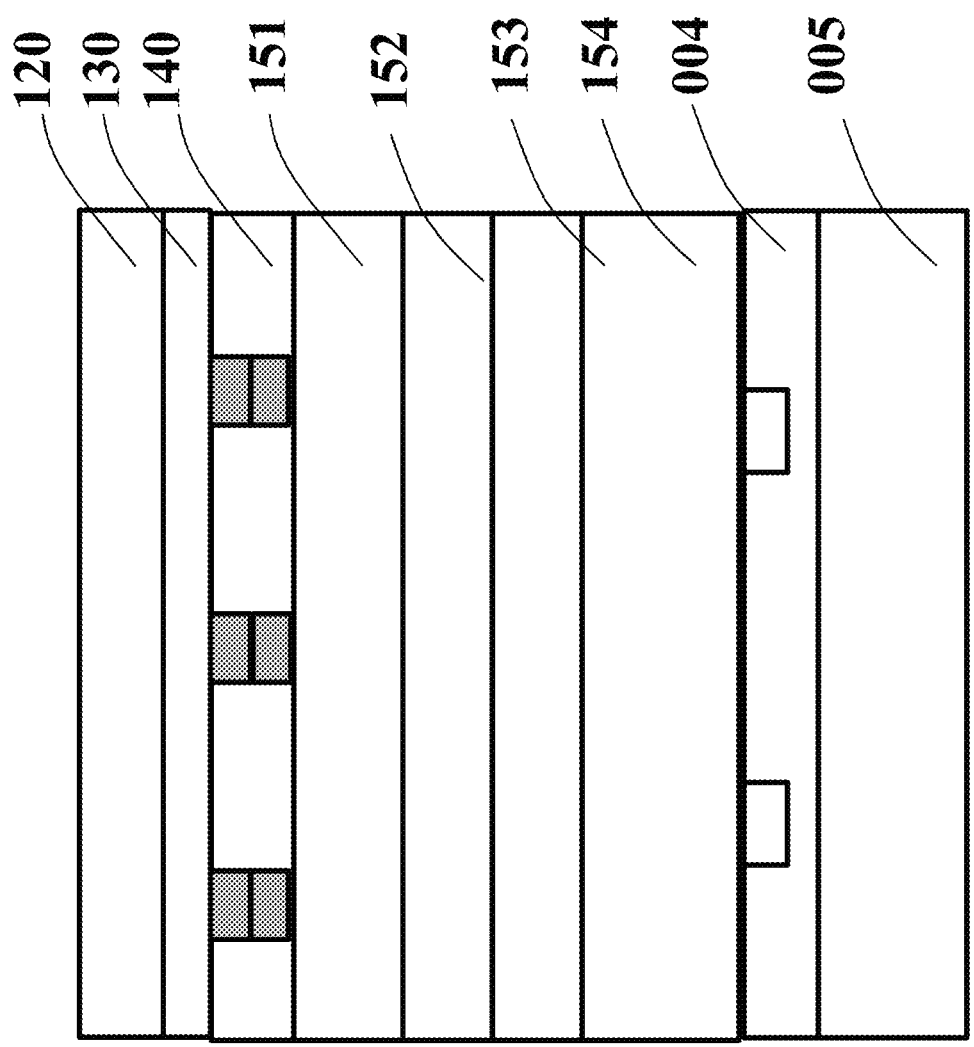
FIG. 8 is a sectional view of a fifth step of a manufacturing process for the light emitting diode as shown in FIG. 1.

With reference to FIG. 8, define a conductive area on the surface of the n-type GaAs ohmic contact layer 003, and remove the n-type GaAs ohmic contact layer 003 in the non-conductive area via etching. Form n-type ohmic contact metal on the n-type GaAs ohmic contact layer in the conductive area; and form a transparent dielectric layer 140 in the non-conductive zone; next, form an ITO layer as the transparent conductive layer 130 via sputtering on the transparent dielectric layer 140; then, form an Ag reflector as the metal reflective layer 120 on the transparent conductive layer 140, and finally form an n-side ohmic contact through thermal treatment. The metal reflective layer is located at the n-side surface of the light emitting layer. Due to lattice match of the n-side material layer and the GaAs substrate, the surface would be particularly smooth during crystal growth, and roughness is significantly less than that of the p-side surface.

Figure 9:
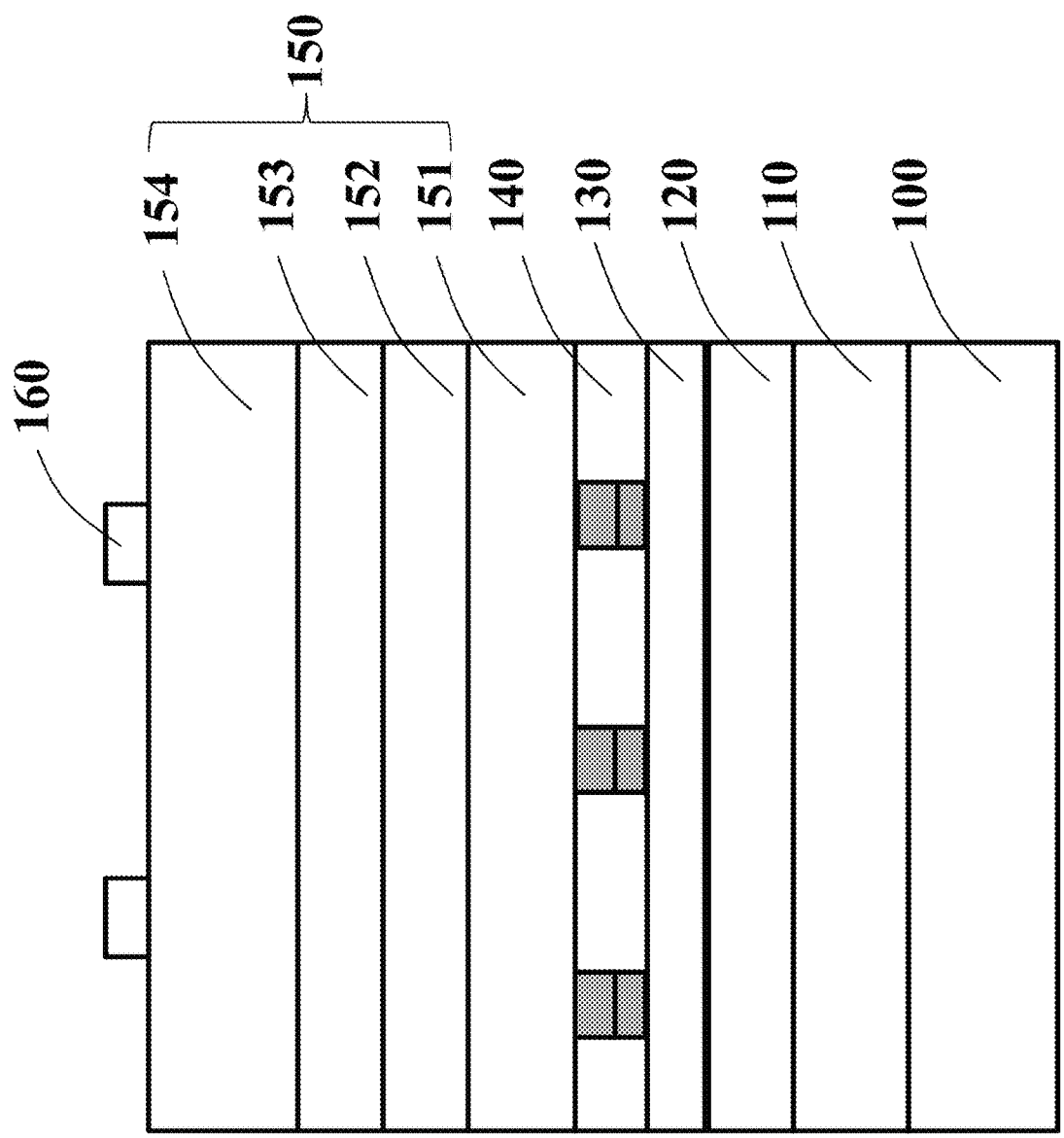
FIG. 9 is a sectional view of a sixth step of a manufacturing process for the light emitting diode as shown in FIG. 1.

With reference to FIG. 9, bond a conductive substrate 100 on the surface of the metal reflective layer via the bonding layer 110, and remove the temporary substrate 005.

In this fabrication method, thermal treatment is done before substrate bonding to form n-side ohmic contact and p-side ohmic contact. As a result, thermal treatment is not required after evaporation of the Ag reflector, which may loss luminance.

Figure 10:
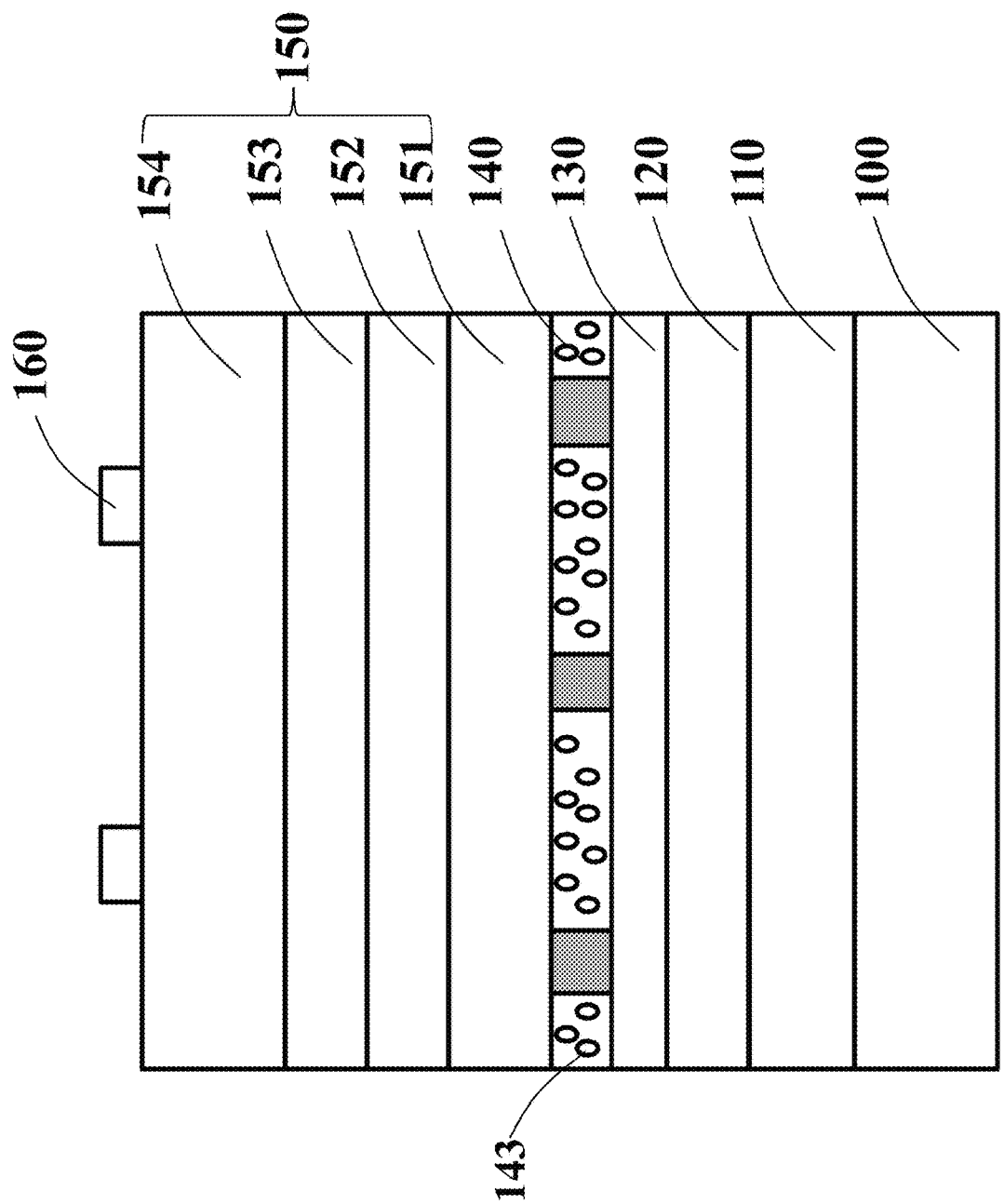
FIG. 10 is a sectional view showing the light emitting diode structure in accordance with Embodiment 2 of the present disclosure.

FIG. 10 shows the light emitting diode according to a second preferred embodiment of the present disclosure. In this embodiment, the transparent dielectric layer 140 is doped with foaming particles 143 which generate gas bubbles when heated, such as $CaCO_3$, $BaCO_3$, $Ca(HCO_3)_2$, $Na_2CO_3$, $NaHCO_3$, thereby reducing refractivity of the transparent dielectric layer 140 and achieving scattering effect. This enhances the total reflection probability of the interface between light-emitting epitaxial laminated layer 150 and the transparent dielectric layer 140. Wherein, the method for which foaming particles generate gas bubbles when heated would only change the refractivity of the transparent dielectric layer 140 without affecting smoothness of the transparent dielectric layer 140. Therefore, it would not affect smoothness and reflectivity of the mirror. In some embodiments, these foaming particles 143 are distributed at the side of the transparent dielectric layer 140 near the light-emitting epitaxial laminated layer 150.

Figure 11:
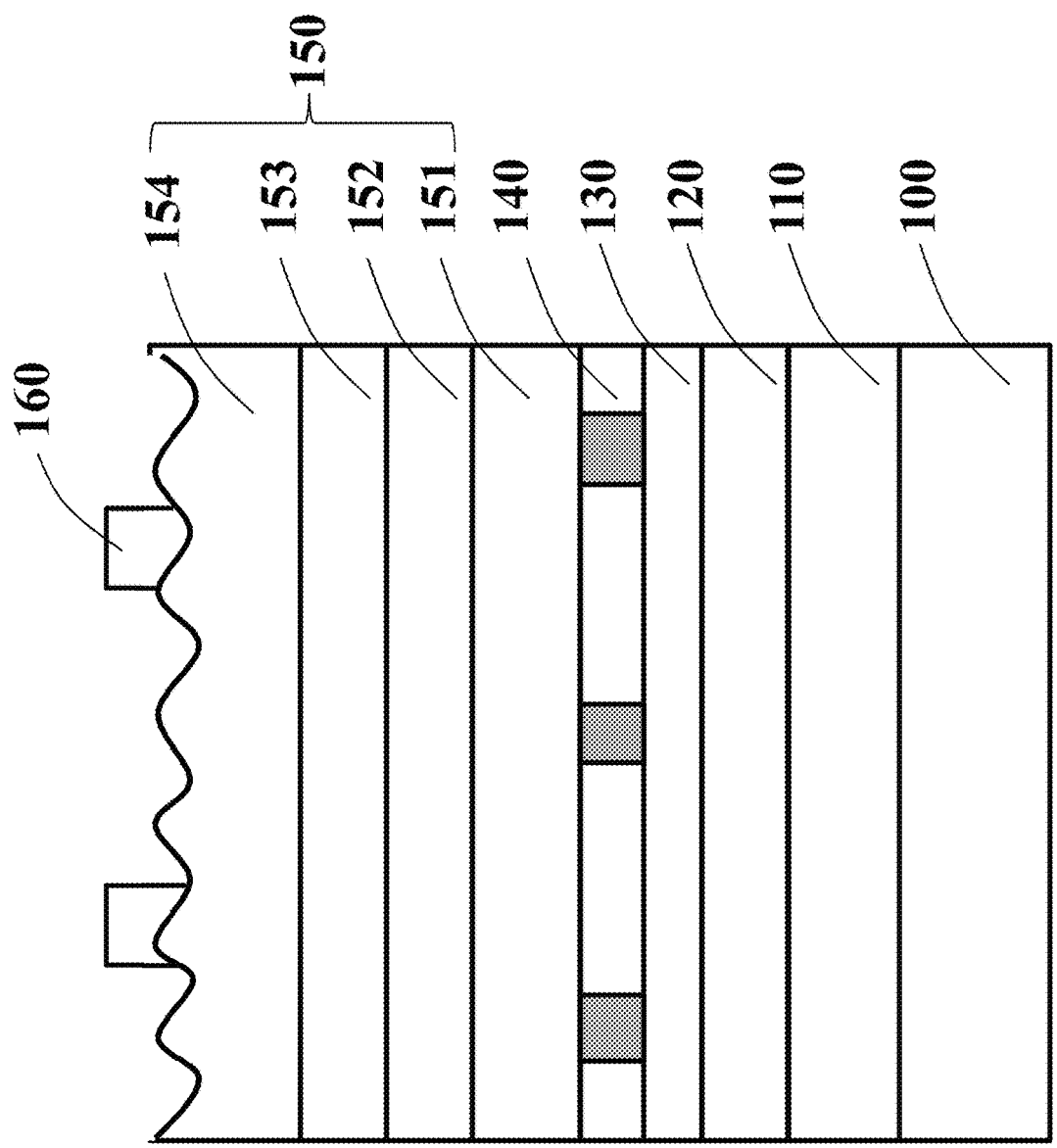
FIG. 11 is a sectional view showing the light emitting diode structure in accordance with Embodiment 3 of the present disclosure.
Figure 12:
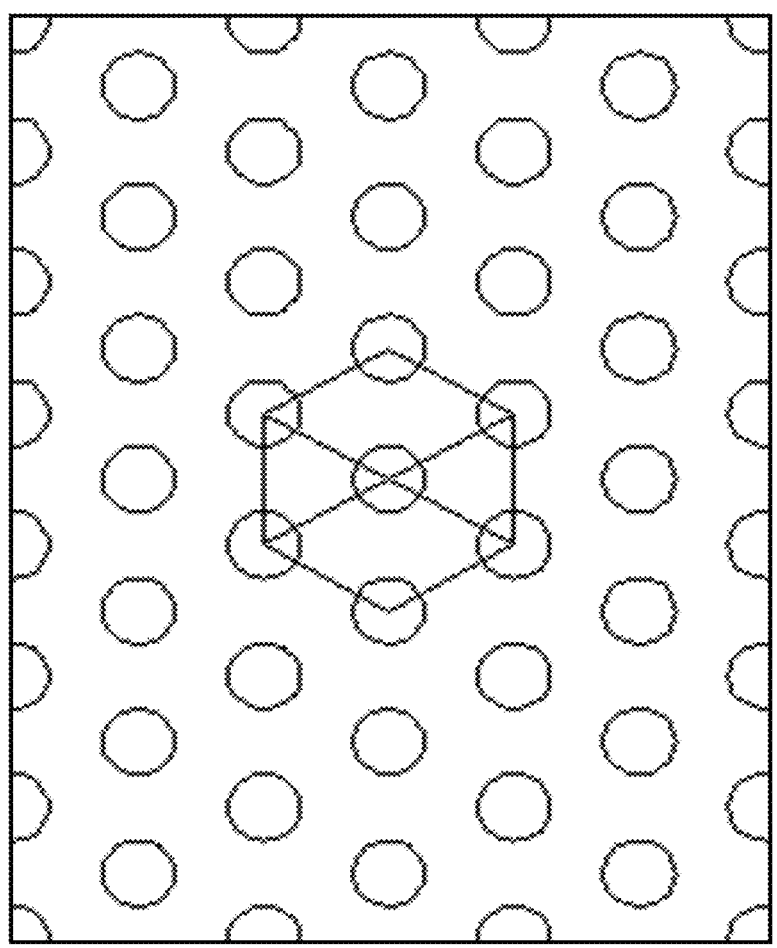
FIG. 12 shows the roughened pattern of the first surface of the light emitting diode as shown in FIG. 11.
Figure 13:
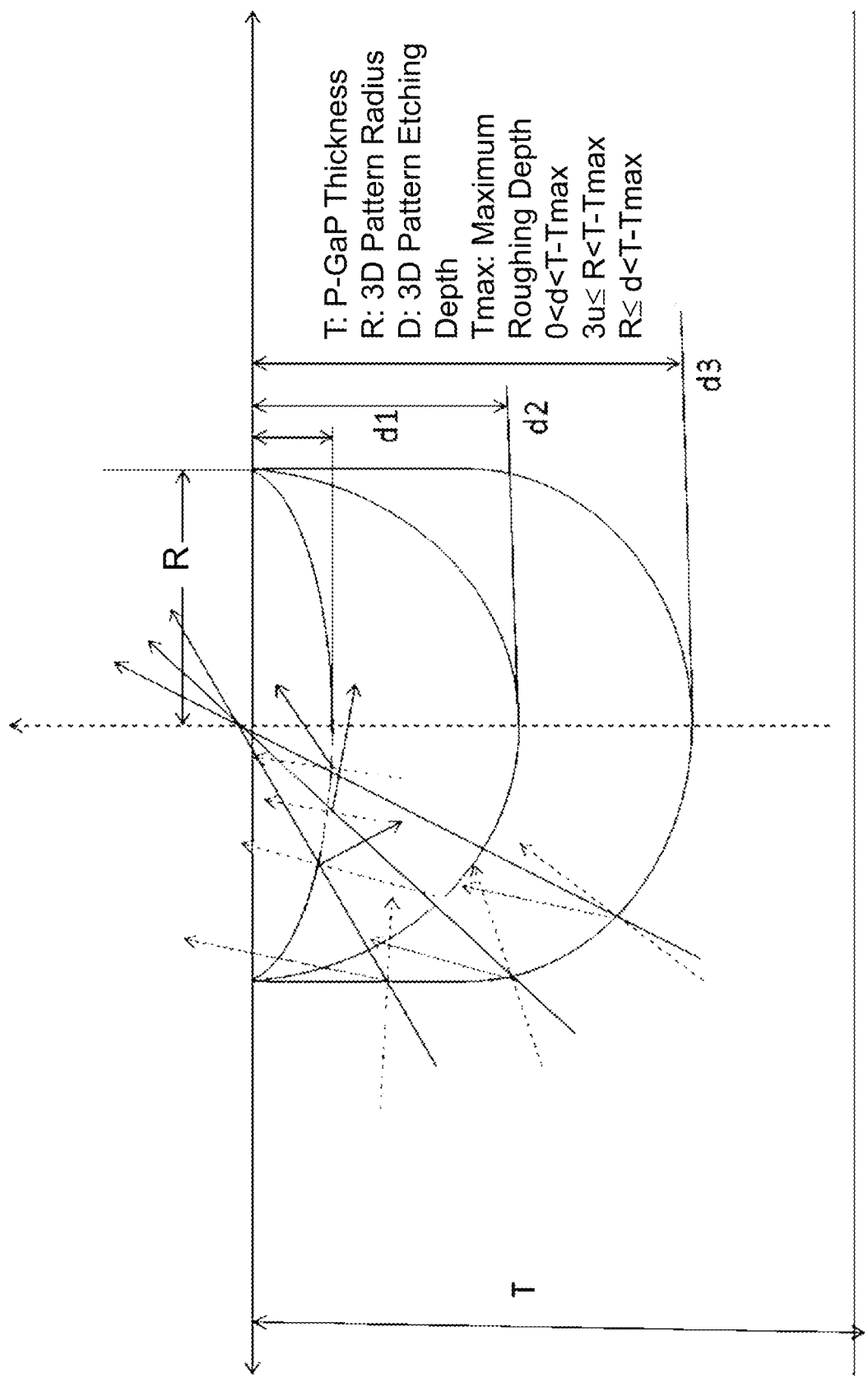
FIG. 13 shows a single hemispherical roughened pattern of the light emitting diode as shown in FIG. 11.

FIG. 11 shows the light emitting diode according to a third preferred embodiment of the present disclosure. In this embodiment, form a roughened pattern in honeycomb structure on the surface of the window layer 154, appearing in regular hexagon as shown in FIG. 12. This structure has high utility rate of space. On this basis, the roughened light-emitting area is larger than the surface area, resulting in high extraction rate. Specifically, an ideal honeycomb structure is a hemispherical structure as shown in FIG. 13. The diameter and depth should meet the requirements below: T: thickness of window layer 154, R: radius of surface 3D pattern; d: etching depth of 3D pattern; $T_{max}$: maximum roughening depth, with relationship of four parameters satisfying: $T_{max}<d<T-T_{max}$, $3u \leq R<T-T_{max}$, $R \leq d<T-T_{max}$.

To further achieve the light emitting efficiency of the light emitting diode, a transparent material layer with low refractivity is added between the reflecting metal layer and the epitaxial laminated layer to form an omnidirectional reflector. Therefore, a part of downward light emitted from the active layer is totally reflected by the transparent material layer, and a part of light is totally reflected by the high-reflectivity metal mirror surface layer, thus enhancing light extraction rate. The embodiments below disclose a light emitting diode structure with an omnidirectional reflector, wherein, preferred refractivity of the transparent material layer is less than 1.5, and a transparent adhesive layer is added between the transparent material layer and the metal reflective layer.

Figure 14:
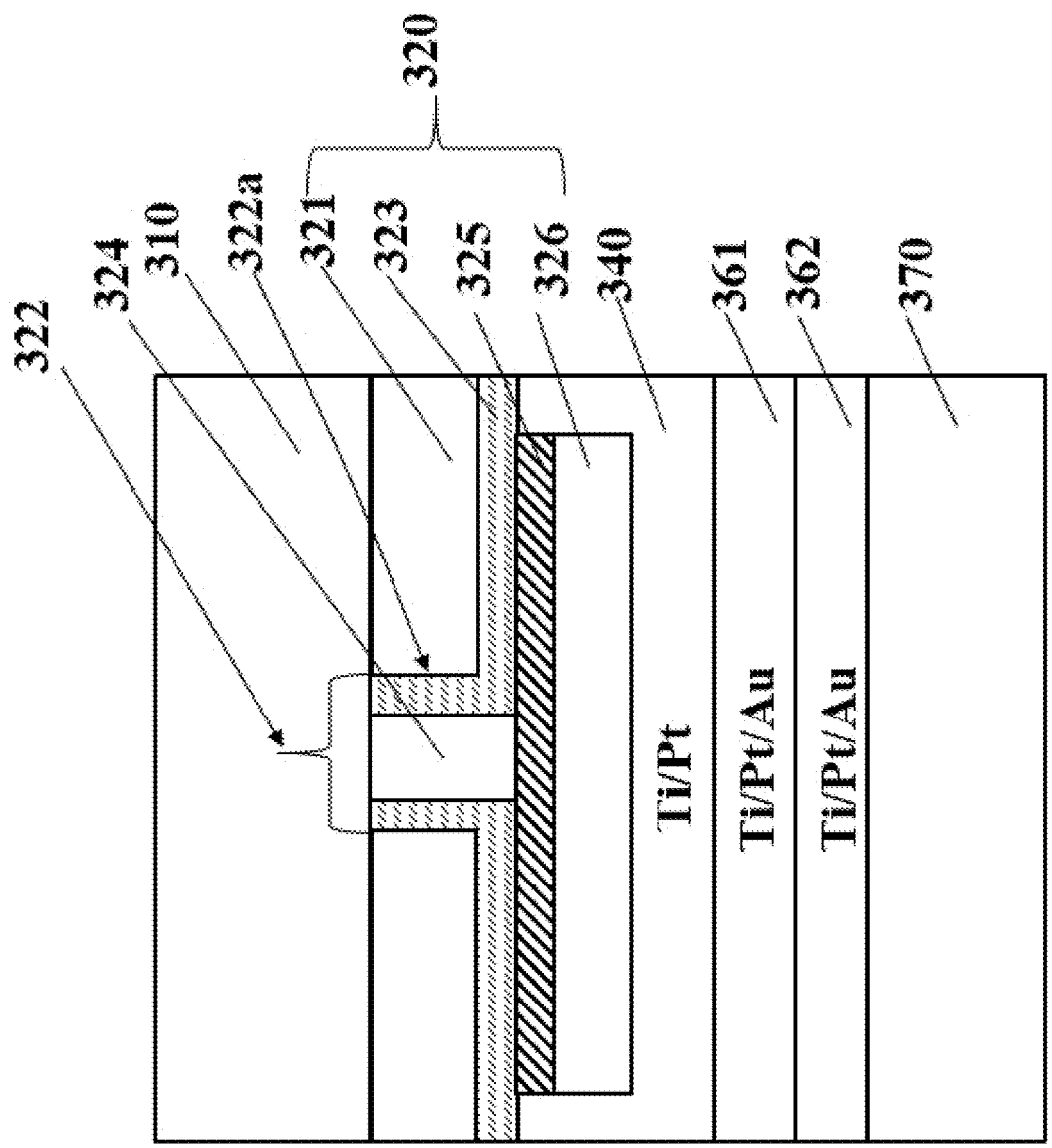
FIG. 14 is a sectional view showing the light emitting diode structure in accordance with Embodiment 4 of the present disclosure.

FIG. 14 is a structural schematic diagram showing the light emitting diode in accordance with a preferred embodiment of the present disclosure. The light emitting diode, from up to bottom, at least comprises a light-emitting epitaxial laminated layer 310, a mirror structure 320, a protective layer 340, an upper bonding layer 361, a lower bonding layer 362 and a conductive substrate 370, wherein, the light-emitting epitaxial laminated layer 310 generally comprises an n-type semiconductor layer, an active layer and a p-type semiconductor layer, which can be n-surface light emitting or p-surface light emitting. For n-surface light emitting, the mirror structure 320 is arranged at the p-type semiconductor side; for p-surface light emitting, the mirror structure is arranged at the n-type semiconductor layer side. The mirror structure 320 consecutively comprises: a transparent dielectric layer 321, a first transparent adhesive layer 323, a second transparent adhesive layer 325 and a metal reflective layer 326.

Specifically, the transparent dielectric layer 321 is made of low-refractivity materials, with preferred refractivity less than 1.5, and more In some embodiments less than 1.4; and thickness is more than 50 nm, for example 50-500 nm. Inside the transparent dielectric layer 321 are a plurality of holes 322 that go through this transparent dielectric layer 321. A first transparent adhesive layer 323 is formed on the surface of the transparent dielectric layer 321, and covers the side wall 322a of the holes 322, which wraps the transparent dielectric layer 321; In some embodiments, the first transparent adhesive layer 323 is made of insulating materials, and preferred thickness is lower than 1/10 that of the transparent dielectric layer, for example, less than 20 nm; the holes 322 are filled with metal materials as the metal ohmic contact layer 324; the second transparent adhesive layer 325 is formed on the first transparent adhesive layer 323; In some embodiments, the transparent adhesive layer 325 is made of conductive materials, and is in contact with the metal ohmic contact layer 324 with preferred thickness less than 10 nm; the metal reflective layer 326 is formed on the surface of the second transparent adhesive layer 325, with area smaller than that of the light-emitting epitaxial laminated layer. The protective layer 340 is formed on the lower surface of the metal reflective layer 326, and wraps the side surface of the metal reflective layer, which can be a single layer or a multi-layer structure mainly used for blocking metal diffusion of the reflective layer, wherein, the upper bonding layer 361 and the lower bonding layer 362 can bond the light-emitting epitaxial laminated layer to the conductive substrate 370, which can be Au—Au bonding, Au—In bonding, and the like.

In this embodiment, the transparent dielectric layer 321 is made of MgF with low refractivity and high thermal conductivity (refractivity n is 1.38, and thermal conductivity is 14-15 W/mk), and thickness is 100-150 nm; the first transparent adhesive layer 323 is a SiO layer having a thickness of 10-15 nm, and the second transparent adhesive layer 325 is a sputtered ITO layer having a thickness of 5-10 nm; the metal reflective layer 326 is an Ag reflector; the metal ohmic contact layer 324 can be AuZn, wherein, the lower surface of the metal ohmic contact layer 324 is flush with the first transparent adhesive layer 323 to ensure that the Ag reflector is flat and the chip wiring is reliable; the protective layer 340 is a Ti/Pt or a Ti/Pt/Au structure; and the upper and lower bonding layers are made of Ti/Pt/Au.

In the aforesaid light emitting diode structure, the $MgF_2$ and Ag mirror serve as the ODR structure, and metal serves as the ohmic contact layer, thus sharply improving LOP. Due to poor adhesiveness of $MgF_2$, a $SiO_2$ thin layer is added as the first adhesive layer; an S-ITO serves as the adhesive layer due to poor adhesiveness between the Ag reflector and $SiO_2$, namely, in this structure, $SiO_2$ and S-ITO serve as the adhesive layers of $MgF_2$ and Ag respectively.

As a variant, the transparent dielectric layer 321 can be a multi-layer structure alternatively laminated by MgF layers and TiO layers. In this case, thickness of the $SiO_2$ layer 323, which serves as the first transparent adhesive layer, is generally controlled less than 1/5 of the thickness of any sub-layer. In a preferred embodiment, thickness of this transparent layer appears gradual distribution, wherein, thickness of the layer adjacent to the epitaxial laminated layer is at maximum and decreases gradually, for example: thickness of the first MgF layer is 590 nm, and thickness of the second MgF layer is 0.25-0.6 times of the thickness of the first MgF layer, and so on; similarly, thickness of the first TiO layer is 92 nm, and thickness of the second TiO layer is 0.25-0.6 times of the thickness of the first TiO layer; and preferred total thickness of the multi-layer film is less than 1 μm.

Figure 15:
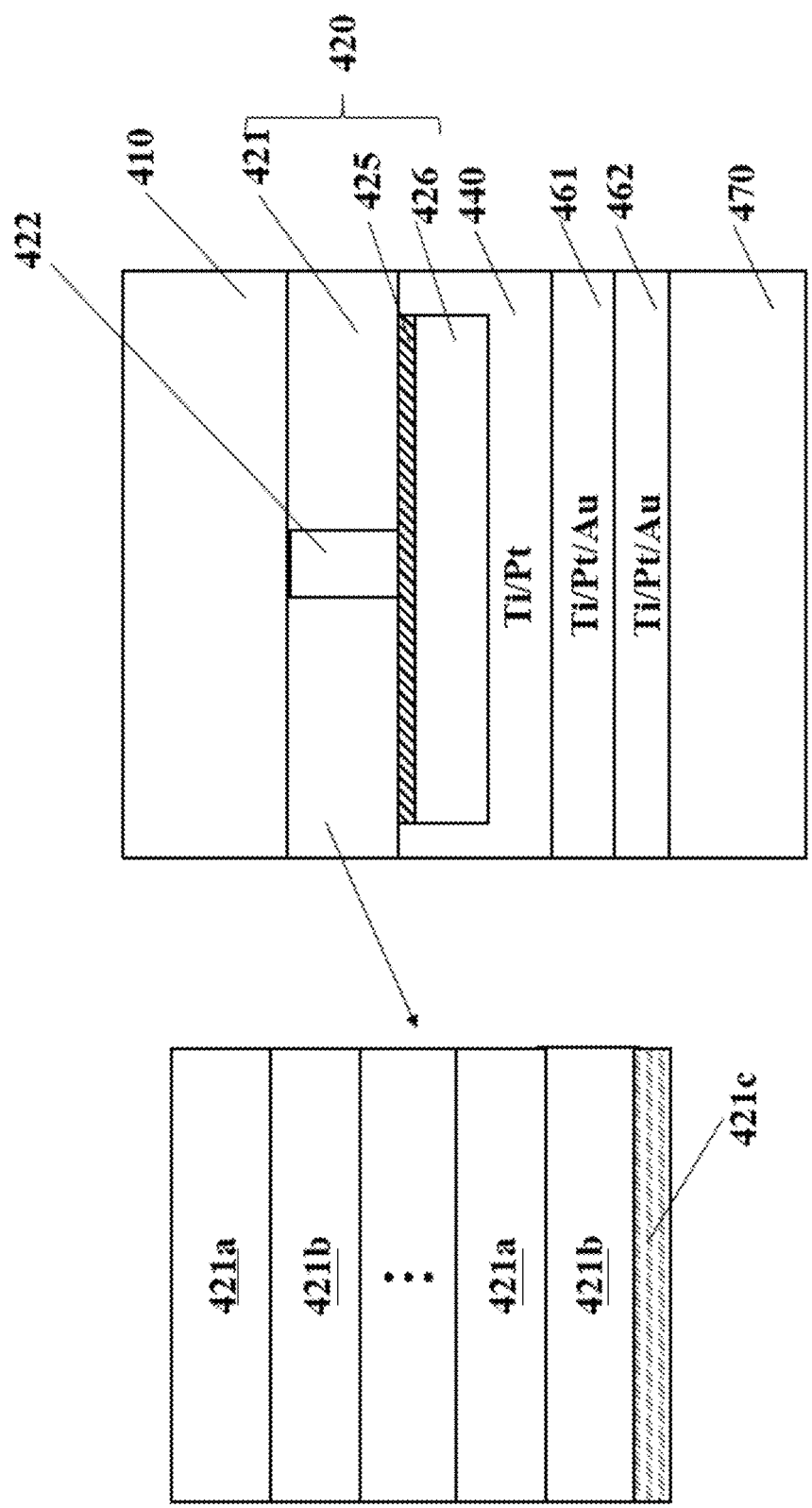
FIG. 15 is a sectional view showing the light emitting diode structure in accordance with Embodiment 5 of the present disclosure.

FIG. 15 is a structural schematic diagram showing the light emitting diode in accordance with a preferred embodiment of the present disclosure. The light emitting diode, from up to bottom, at least comprises a light-emitting epitaxial laminated layer 410, a mirror structure 420, a protective layer 440, an upper bonding layer 461, a lower bonding layer 462 and a conductive substrate 470, wherein, the mirror structure 420 consecutively comprises: a transparent dielectric layer 421, a transparent conductive adhesive layer 425 and a metal reflective layer 426.

The transparent dielectric layer 421 is located on the non-light-emitting surface of the light-emitting epitaxial laminated layer 410, inside which are a plurality of holes 422 that go through this dielectric layer, and the inside is filled with conductive metal, serving as the metal ohmic contact layer that is in contact with the light-emitting epitaxial laminated layer. The transparent dielectric layer is a multi-layer structure, wherein, the side adjacent to the light-emitting epitaxial laminated layer is alternatively composed of a plurality of first sub-layers 421a and second sub-layers 421b, and finally forms a third sub-layer 421c, which is a thin-layer structure; in each pair of the first sub-layer and the second sub-layer, thickness of the first sub-layer is In some embodiments more than that of the second sub-layer; the third sub-layer 421c mainly serves as the adhesive layer, with thickness less than 1/10 of the total thickness of the entire transparent dielectric layer. In this embodiment, In some embodiments, the first sub-layer 421a and the second sub-layer 421b are alternatively laminated by MgF layers and TiO layers, and the third sub-layer 421c is made of $SiO_2$, wherein, thickness of the first sub-layers and the second sub-layers can be fixed or gradual; preferred thickness of the third sub-layer is less than 20 nm, and for example can be 10 nm. In a specific example, thickness of the first sub-layer and the second sub-layer appears gradual distribution, wherein, thickness of the layer that is adjacent to the epitaxial laminated layer is at maximum and decreases gradually, for example: thickness of the first MgF layer is 590 nm, and thickness of the second MgF layer is 0.25-0.6 times of the thickness of the first MgF layer, and so on; similarly, thickness of the first TiO layer is 92 nm, and thickness of the second TiO layer is 0.25-0.6 times of the thickness of the first TiO layer; and preferred total thickness of the multi-layer film is less than 1 μm.

Preferred included angle between the side wall of the metal reflective layer 426 and the surface of the light-emitting epitaxial laminated layer 410 is less than 90°, and In some embodiments 45-85°, forming a gapless connection between the anti-diffusion protective layer 440 and the metal reflective layer 426 without voids or cracks, thereby effectively improving product quality and reliability.

To have a better luminance of LED chip, a common practice is to provide an Ag mirror in the mirror structure of the LED. However, Ag material, which is highly active and prone to migration, may result in failure of the LED during usage. To this end, one effective method is to pattern the Ag mirror structure and wrap the system inside the LED so that no Ag is exposed at the side wall. Ag mirror structure is generally patterned via wet etching.

Figure 16:
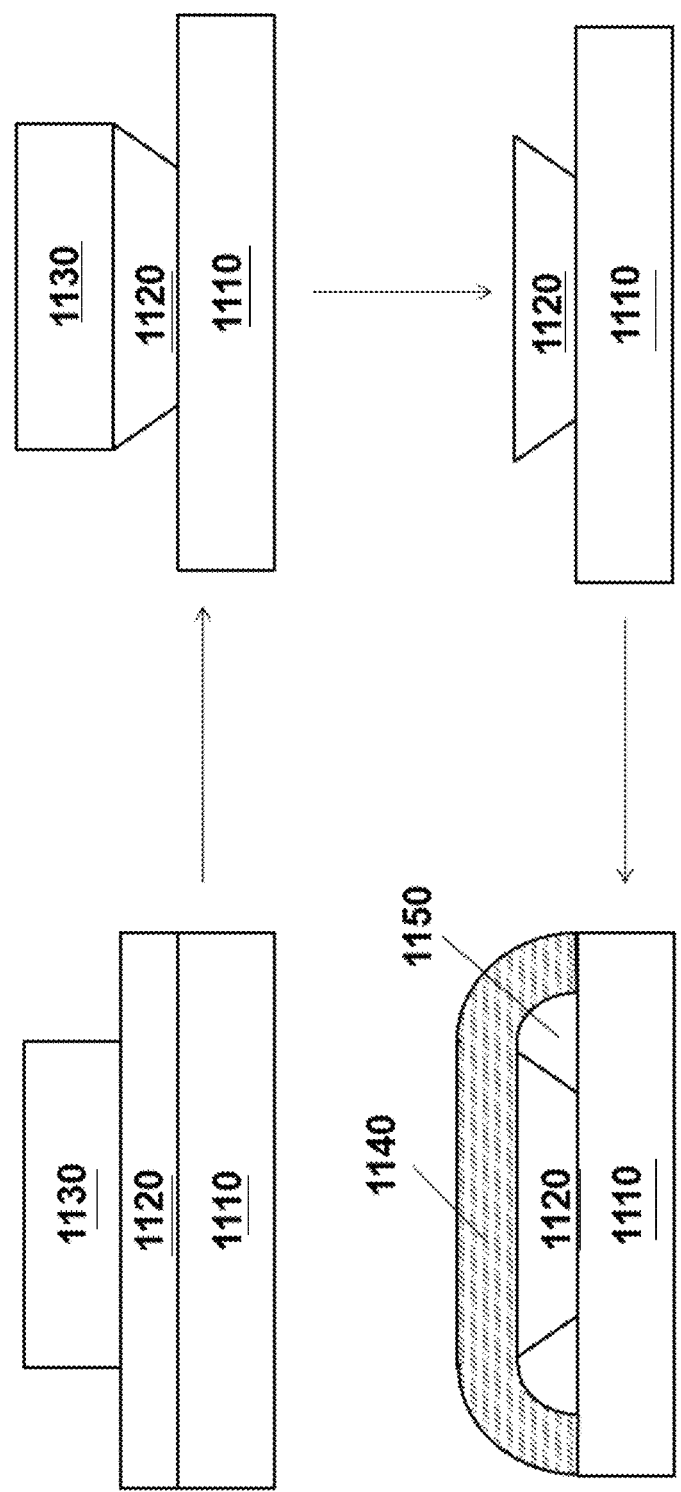
FIG. 16 is a flow diagram showing the patterned Ag reflector via wet etching.
Figure 17:
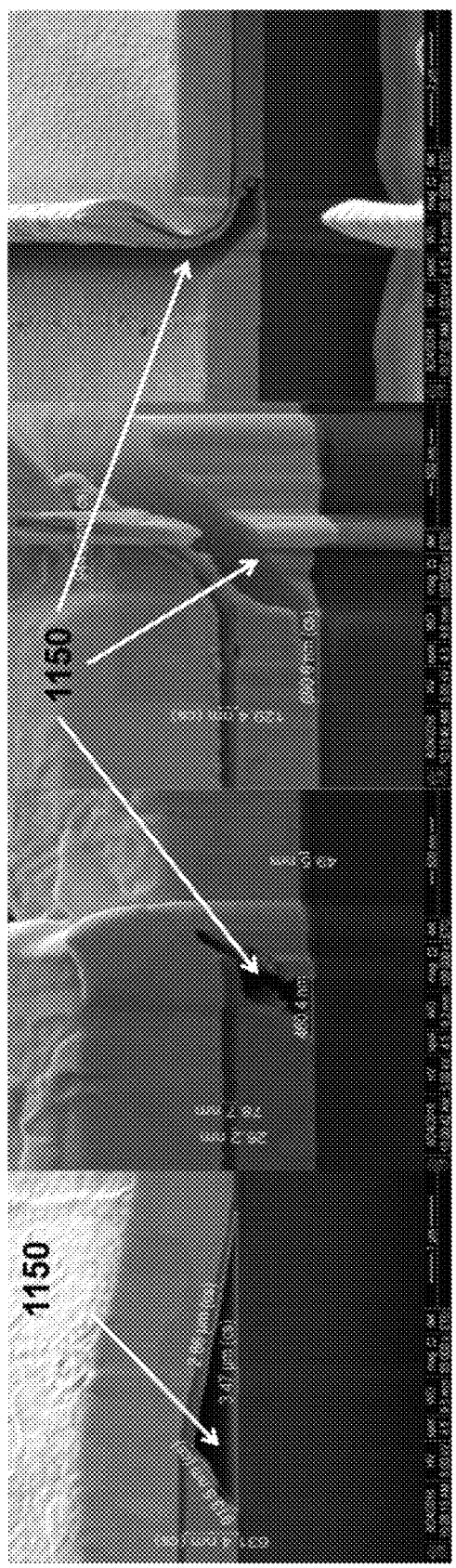
FIG. 17 is a physical diagram of the Ag reflector formed in accordance with the method described in FIG. 16.

FIG. 16 is a flow diagram showing the patterned Ag reflector via wet etching. However, during side wall etching of the Ag reflector, due to the difference of etching rate between the upper side and the lower side, it is common to see an inverted trapezoidal Ag reflector structure. This will subsequently cause incomplete coverage of protective metal, and result in voids or cracks 1150, as shown in FIG. 17. The voids and cracks are likely to cause chip failure during usage.

Therefore, the following embodiments provide a new fabrication method for an Ag reflector to avoid the inverted trapezoidal during Ag etching, which avoids voids and cracks and improves chip quality and reliability. Specifically, pretreat the upper surface at the edge of the Ag reflector before etching. The pretreated Ag reacts more quickly, thus improving the etching rate of the upper surface at the edge of the Ag reflector. Then, etch the pretreated Ag to form a rectangle section, and In some embodiments a regular trapezoidal.

At first, provide an epitaxial structure 1210, and the light-emitting epitaxial laminated layer generally comprises a first semiconductor layer, an active layer and a second semiconductor layer. When the first semiconductor layer is a p-type semiconductor, the second semiconductor layer can be an n-type semiconductor in different electrical property and vice versa. The active layer can be a neutral, a p-type or an n-type semiconductor. When applied current passes through the semiconductor light-emitting laminated layer, it triggers the active layer to emit light. When the active layer is made of nitride-based material, blue or green light will be emitted; when made of AlInGaP-based material, red, orange or yellow light in amber color will be emitted.

Figure 18:
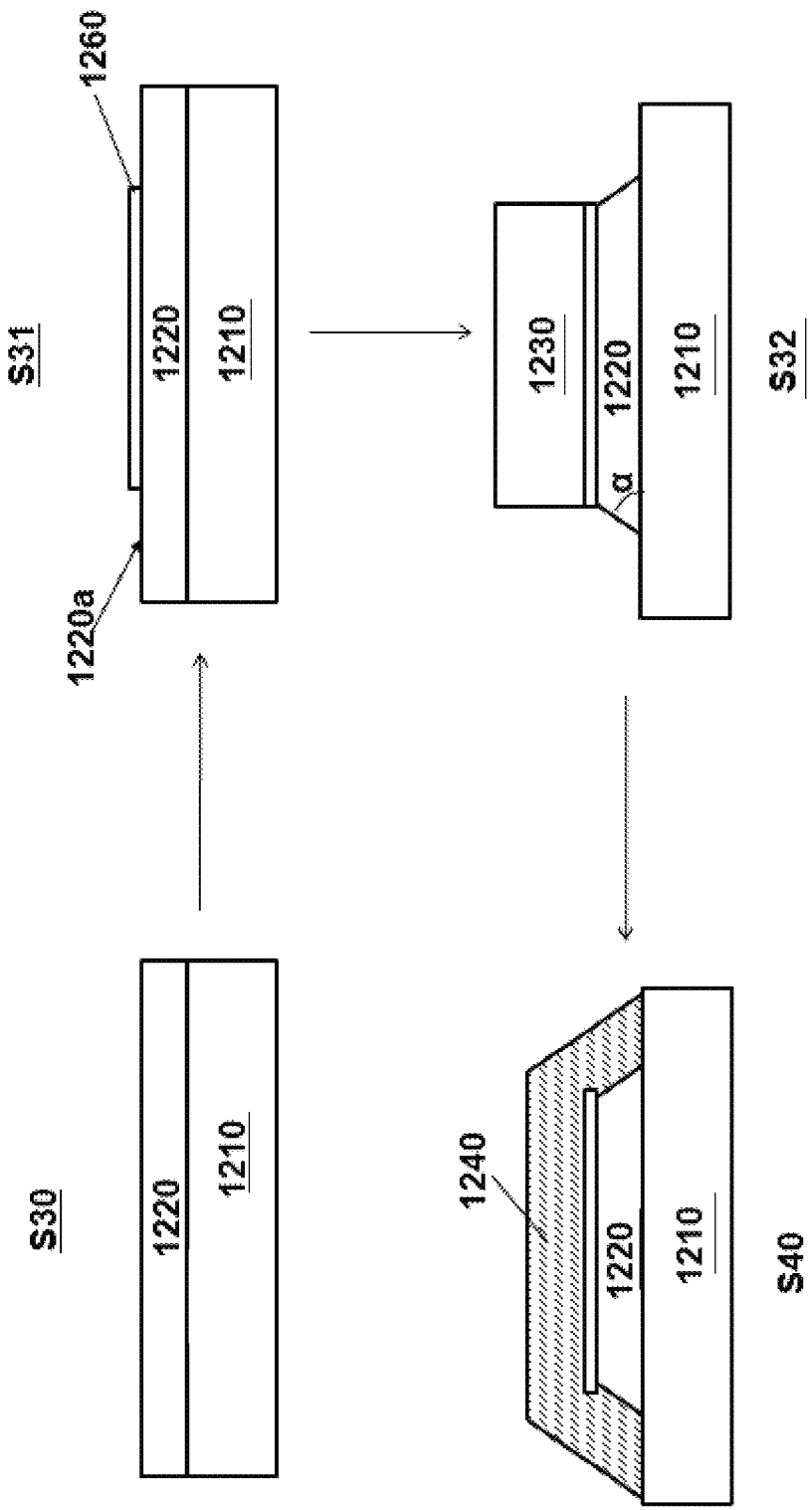
FIG. 18 is a flow diagram showing the patterned Ag reflector in accordance with the present invention.

Then, form a highly-reliable reflective layer structure on the upper surface of the light-emitting epitaxial laminated layer 1210, mainly including S30~S33, as shown in FIG. 18, specifically:

S30: form a metal reflective layer 1220 on the upper surface of the light-emitting epitaxial laminated layer 1210, wherein, an Ag reflector is preferred;

S31: pretreat the edge of the metal reflective layer so that the Ag on the edge surface reacts more quickly, thus improving the etching rate of the upper surface at the edge of the Ag reflector. In an embodiment, form an isolating layer 1260 in the middle of the metal reflective layer 1220. The isolating layer made of metal or conductive oxide is mainly used to protect the surface in the middle of the Ag reflector during pretreatment. Thickness is above 20 nm, and preferred thickness is 50 nm, such as 50-100 nm;

S32: form a mask layer on the isolating layer 1260, and etch the edge of the metal reflective layer 1220 to obtain a metal reflective layer 1220 having a rectangle or trapezoid section as the edge surface is preheated. The included angle α between the side wall of the etched metal reflective layer and the light-emitting epitaxial laminated layer 1210 is below 90°, and preferred angle is 30-85°;

S33: cover a protective layer 1240 on the surface of the metal reflective layer 1220, which is In some embodiments made of inert metal material, such as Ti, Pt, Au, etc. The protective layer 1240 totally covers the upper surface and the side wall of the metal reflective layer 1220, and forms gapless connection to the metal reflective layer.

Figure 19:
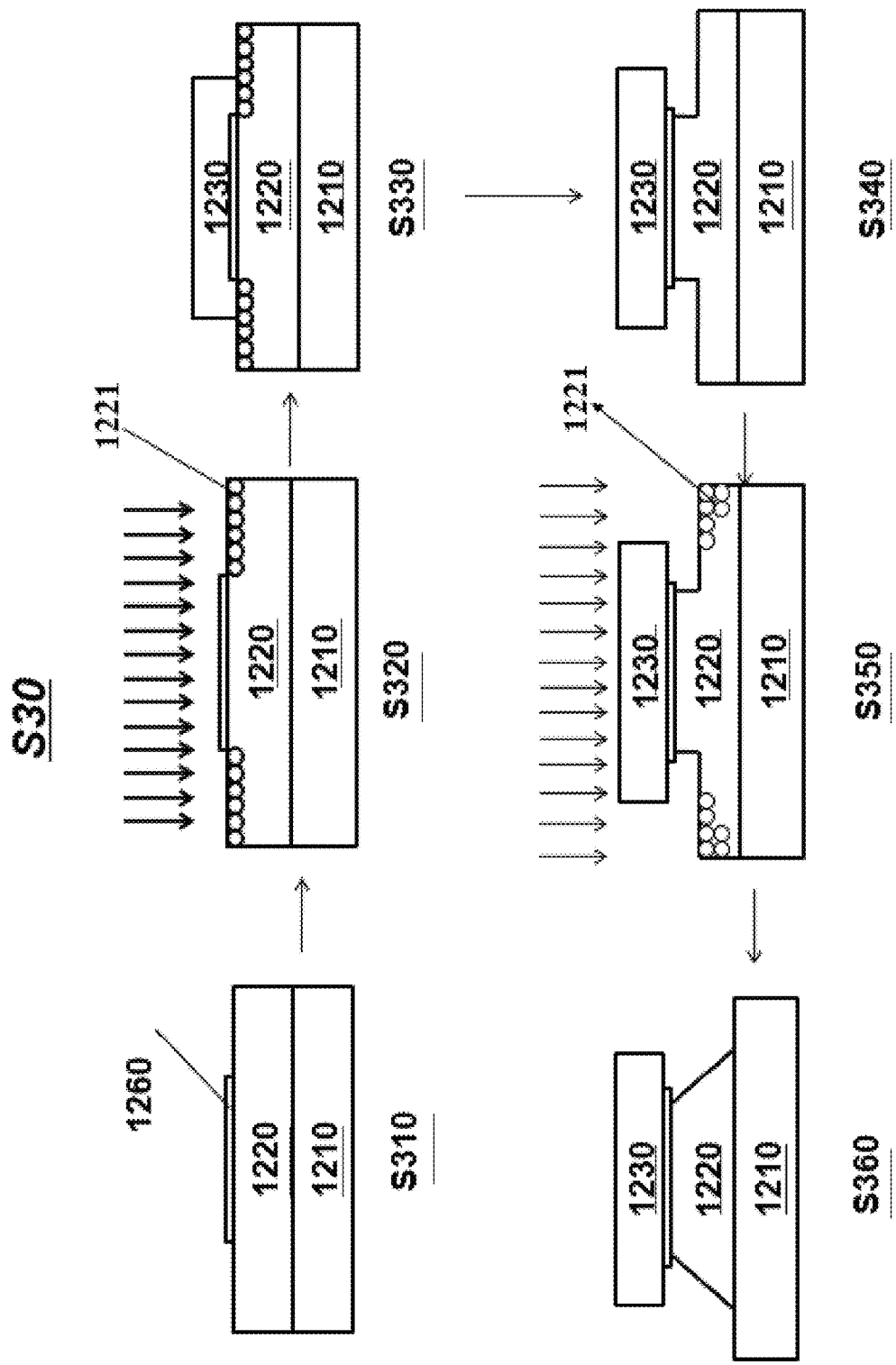
FIG. 19 is a flow diagram showing the treatment method for improving the Ag mirror structure of the LED in accordance with a preferred embodiment of the present invention.

FIG. 19 is a flow diagram showing the treatment method for improving the Ag mirror structure of the LED in accordance with a preferred embodiment of the present invention, mainly comprising steps S310-S360:

S310: form an Ag reflector 1220 on the non-light-emitting surface 1210 of the LED epitaxial laminated layer, and form an Ti metal layer 1260 in the middle of the Ag reflector 1220, wherein, preferred thickness of the Ti metal layer is 50 nm-100 nm;

S320: take the Ti metal layer 1260 as the protective layer, and perform oxidation treatment for the exposed Ag reflector 1220. In this embodiment, use the Plasma oxidation machine to oxide the Ag reflector, and the Ag 1221 on the edge surface not covered by the protective layer is oxidized, as shown in FIG. 19;

S330: form a mask layer 1230 on the upper surface of the Ti metal layer 1260, and at least expose a part of the oxidized Ag reflector 1220;

S340: wet etch the surface of the edge of the Ag reflector 1220 so that the Ag reflector appears a step shape;

S350: take the mask layer 1230 as the protective layer, and perform a second surface oxidation treatment for the exposed Ag;

S360: wet etch the Ag reflector again to form an Ag reflector having a regular trapezoidal section.

Finally, cover the protective layer 1240 on the patterned Ag reflector 1220.

In this embodiment, after the patterned Ag reflector 1220 appears a regular trapezoid, no voids or cracks will be formed on the contact interface in subsequent coverage of protective metal, thus effectively improving product quality and reliability. In this embodiment, one oxidation treatment is also acceptable, which can be followed by a second oxidation when the effect of the first oxidation treatment is not obvious, and then conduct a second etching to form an ideal Ag reflector 1220.

To further achieve the light emitting efficiency of the light emitting diode, a transparent material layer with low refractivity is added between the reflecting metal layer and the epitaxial laminated layer to form an omnidirectional reflector. Therefore, a part of downward light emitted from the active layer is totally reflected by the transparent material layer, and a part of light is totally reflected by the high-reflectivity metal mirror surface layer, thus enhancing light extraction rate. The embodiments below disclose a light emitting diode structure with an omnidirectional reflector, wherein, preferred refractivity of the transparent material layer is less than 1.5, and a transparent adhesive layer is added between the transparent material layer and the metal reflective layer.

Figure 20:
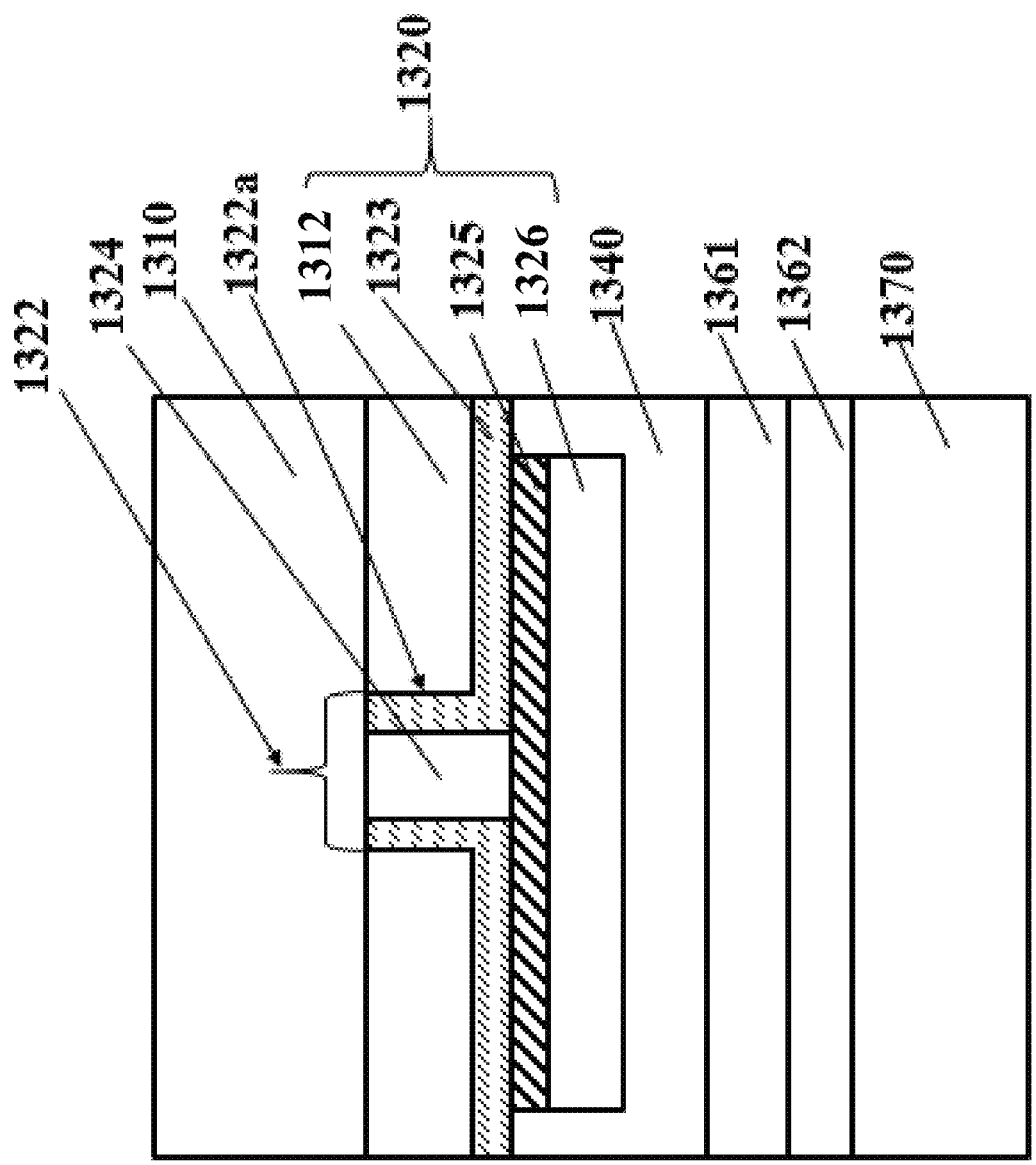
FIG. 20 is a structural diagram showing the light emitting diode in accordance with a preferred embodiment of the present disclosure.

FIG. 20 is a structural schematic diagram showing the light emitting diode in accordance with a preferred embodiment of the present disclosure. The light emitting diode, from up to bottom, at least comprises a light-emitting epitaxial laminated layer 1310, a mirror structure 1320, a protective layer 1340, an upper bonding layer 1361, a lower bonding layer 1362 and a conductive substrate 1370, wherein, the light-emitting epitaxial laminated layer 1310 generally comprises an n-type semiconductor layer, an active layer and a p-type semiconductor layer, which can be n-surface light emitting or p-surface light emitting. For n-surface light emitting, the mirror structure 1320 is arranged at the p-type semiconductor side; for p-surface light emitting, the mirror structure is arranged at the n-type semiconductor layer side. The mirror structure 1320 consecutively comprises: a transparent dielectric layer 1321, a first transparent adhesive layer 1323, a second transparent adhesive layer 1325 and a metal reflective layer 1326.

Specifically, the transparent dielectric layer 1321 is made of low-refractivity materials, with preferred refractivity less than 1.5, and more In some embodiments less than 1.4; and thickness is more than 50 nm, for example 50-500 nm. Inside the transparent dielectric layer 1321 are a plurality of holes 1322 that go through this transparent dielectric layer 1321; a first transparent adhesive layer 1323 is formed on the surface of the transparent dielectric layer 1321, and covers the side wall 1322a of the holes 1322, which wraps the transparent dielectric layer 1321; In some embodiments, the first transparent adhesive layer 1323 is made of insulating materials, and preferred thickness is lower than ¹/₁₀ that of the transparent dielectric layer, for example, less than 20 nm; the holes 1322 are filled with metal materials as the metal ohmic contact layer 1324; the second transparent adhesive layer 1325 is formed on the first transparent adhesive layer 1323; In some embodiments, the transparent adhesive layer 1325 is made of conductive materials, and is in contact with the metal ohmic contact layer 1324 with preferred thickness less than 10 nm; the metal reflective layer 1326 is formed on the surface of the second transparent adhesive layer 1325, with area smaller than that of the light-emitting epitaxial laminated layer. The protective layer 1340 is formed on the lower surface of the metal reflective layer 1326, and wraps the side surface of the metal reflective layer, which can be a single layer or a multi-layer structure mainly used for blocking metal diffusion of the reflective layer, wherein, the upper bonding layer 1361 and the lower bonding layer 1362 can bond the light-emitting epitaxial laminated layer to the conductive substrate 1370, which can be Au—Au bonding, Au—In bonding, and the like.

In this embodiment, the transparent dielectric layer 1321 is made of MgF with low refractivity and high thermal conductivity (refractivity n is 1.38, and thermal conductivity is 14-15 W/mk), and thickness is 100-150 nm; the first transparent adhesive layer 1323 is a SiO₂ layer having a thickness of 10-15 nm, and the second transparent adhesive layer 1325 is a sputtered ITO layer having a thickness of 5-10 nm; the metal reflective layer 1326 is an Ag reflector; the metal ohmic contact layer 1324 can be AuZn, wherein, the lower surface of the metal ohmic contact layer 1324 is flush with the first transparent adhesive layer 1323 to ensure that the Ag reflector is flat and the chip wiring is reliable; the protective layer 1340 is a Ti/Pt or a Ti/Pt/Au structure; and the upper and lower bonding layers are made of Ti/Pt/Au.

In the aforesaid light emitting diode structure, the MgF₂ and Ag mirror serve as the ODR structure, and metal serves as the ohmic contact layer, thus sharply improving LOP. Due to poor adhesiveness of MgF₂, a SiO₂ thin layer is added as the first adhesive layer; an S-ITO serves as the adhesive layer due to poor adhesiveness between the Ag reflector and SiO₂, namely, in this structure, SiO₂ and S-ITO serve as the adhesive layers of MgF₂ and Ag respectively.

Figure 21:
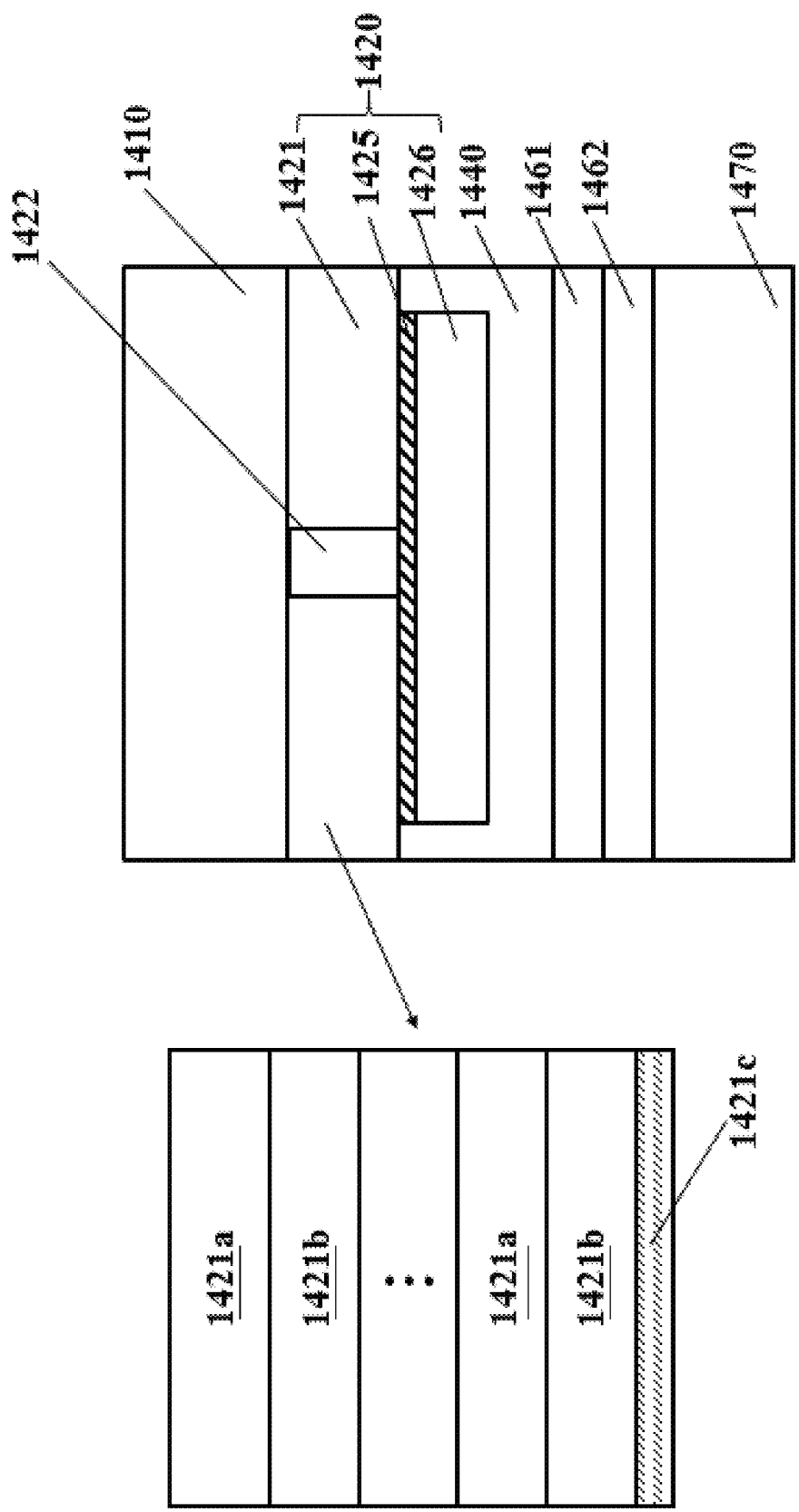
FIG. 21 is a structural diagram showing the light emitting diode in accordance with another preferred embodiment of the present disclosure.

FIG. 21 is a structural schematic diagram showing the light emitting diode in accordance with a preferred embodiment of the present disclosure. The light emitting diode, from up to bottom, at least comprises a light-emitting epitaxial laminated layer 1410, a mirror structure 1420, a protective layer 1440, an upper bonding layer 1461, a lower bonding layer 1462 and a conductive substrate 1470, wherein, the mirror structure 1420 consecutively comprises: a transparent dielectric layer 1421, a transparent conductive adhesive layer 1425 and a metal reflective layer 1426.

The transparent dielectric layer 1421 is arranged on the non-light-emitting surface of the light-emitting epitaxial laminated layer 1410, inside which are a plurality of holes 1422 that go through this dielectric layer, and the inside is filled with conductive metal, serving as the metal ohmic contact layer that is in contact with the light-emitting epitaxial laminated layer. The transparent dielectric layer is a multi-layer structure, wherein, the side adjacent to the light-emitting epitaxial laminated layer is alternatively composed of a plurality of first sub-layers 1421a and second sub-layers 1421b, and finally forms the third sub-layer 1421c, which is a thin-layer structure. In each pair of the first sub-layer and the second sub-layer, In some embodiments, thickness of the first sub-layer is more than that of the second sub-layer. The third sub-layer 1421c mainly serves as the adhesive layer, with thickness less than ¹/₁₀ of the total thickness of the entire transparent dielectric layer. In this embodiment, In some embodiments, the first sub-layer 1421a and the second sub-layer 1421b are alternatively laminated by MgF layers and TiO layers, and the third sub-layer 1421c is made of SiO₂, wherein, thickness of the first sub-layer and the second sub-layer can be fixed or gradual. Preferred thickness of the third sub-layer is less than 20 nm, and can be 10 nm for instance. In a specific example, thickness the first sub-layer and the second sub-layer appears gradual distribution, wherein, thickness of the layer that is adjacent to the epitaxial laminated layer is at maximum and decreases gradually, for example: thickness of the first MgF layer is 590 nm, and thickness of the second MgF layer is 0.25-0.6 times of the thickness of the first MgF layer, and so on; similarly, thickness of the first TiO layer is 92 nm, and thickness of the second TiO layer is 0.25-0.6 times of the thickness of the first TiO layer; and preferred total thickness of the multi-layer film is less than 1 μm.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode (LED), comprising:
   a light-emitting epitaxial laminated layer having a first surface and a second, opposing, surface, including an n-type semiconductor layer, a light emitting layer, and a p-type semiconductor layer;
   an omnidirectional reflector structure formed on the second surface of the light-emitting epitaxial laminated layer, including a transparent dielectric layer located on the second surface of the light-emitting epitaxial laminated layer and having conductive holes therein;
   a first transparent adhesive layer on one side surface of the transparent dielectric layer that is distal from the light-emitting epitaxial laminated layer;
   a second transparent adhesive layer on one side surface of the first transparent adhesive layer that is distal from the transparent dielectric layer; and
   a metal reflective layer on one side surface of the second transparent adhesive layer that is distal from the first transparent adhesive layer.

2. The LED of claim 1, wherein a thickness of the transparent dielectric layer is larger than 50 nm.

3. The LED of claim 1, wherein the first transparent adhesive layer is a transparent isolating adhesive layer covering one side surface of the transparent dielectric layer that is distal from the light-emitting epitaxial laminated layer.

4. The LED of claim 1, wherein a thickness of the first transparent adhesive layer is less than 20 nm.

5. The LED of claim 1, wherein the second transparent adhesive layer is a transparent conductive adhesive layer.

6. The LED of claim 5, wherein a thickness of the second transparent adhesive layer is less than 10 nm.

7. The LED of claim 5, wherein a thickness of the first transparent adhesive layer is less than 1/10 of the thickness of the transparent dielectric layer.

8. The LED of claim 1, wherein:
   the transparent dielectric layer comprises a plurality of sub-layers; and
   a thickness of the first transparent adhesive layer is less than 1/5 of a thickness of any sub-layer of the transparent dielectric layer.

9. The LED of claim 1, wherein:
   the transparent dielectric layer is an MgF layer;
   the first transparent adhesive layer is a SiO layer;
   the second transparent adhesive layer is a sputtered ITO layer; and
   the metal reflective layer is an Ag reflector.

10. The LED of claim 1, further comprising a diffusion blocking layer wrapping a surface and a side wall at a side of the metal reflective layer that is distal from the light-emitting epitaxial laminated layer.

11. The LED of claim 1, wherein:
    the conductive holes are filled with a metal ohmic contact layer;
    the surface at the side that is distal from the epitaxial laminated layer is flush with the first transparent adhesive layer.

* * * * *